US010772208B2

(12) United States Patent
Lee

(10) Patent No.: US 10,772,208 B2
(45) Date of Patent: Sep. 8, 2020

(54) PRINTED CIRCUIT BOARD PACKAGE AND DISPLAY DEVICE INCLUDING THE SAME

(71) Applicant: SAMSUNG DISPLAY CO., LTD., Yongin-si, Gyeonggi-do (KR)

(72) Inventor: Hee Kwon Lee, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 5 days.

(21) Appl. No.: 16/151,881

(22) Filed: Oct. 4, 2018

(65) Prior Publication Data

US 2019/0306986 A1    Oct. 3, 2019

(30) Foreign Application Priority Data

Mar. 29, 2018  (KR) .................. 10-2018-0036272

(51) Int. Cl.
H05K 1/18      (2006.01)
G06F 3/044     (2006.01)
G06K 9/00      (2006.01)
H05K 1/11      (2006.01)
H05K 1/02      (2006.01)

(52) U.S. Cl.
CPC ............ *H05K 1/183* (2013.01); *G06F 3/044* (2013.01); *G06K 9/0002* (2013.01); *H05K 1/028* (2013.01); *H05K 1/111* (2013.01); *G06F 2203/04105* (2013.01); *H05K 2201/056* (2013.01); *H05K 2201/10128* (2013.01); *H05K 2201/10151* (2013.01)

(58) Field of Classification Search
CPC .... G06F 21/032; G06F 3/0414; G06F 3/0412; G06F 3/0488; G06F 3/041; G06F 3/0338; H05K 1/028; H05K 1/189; H05K 1/147; H05K 1/183; H05K 2201/10151; H05K 2201/10128; H05K 2201/09036; H05K 5/0017

See application file for complete search history.

(56) References Cited

U.S. PATENT DOCUMENTS

| 5,886,877 A * | 3/1999 | Shingai | H01L 21/4853 361/768 |
| 2012/0017703 A1 * | 1/2012 | Ikebe | B25J 13/083 73/862.626 |
| 2013/0229761 A1 * | 9/2013 | Shaw | G06F 1/1618 361/679.08 |
| 2016/0190522 A1 * | 6/2016 | Lee | H01L 51/0097 257/40 |
| 2016/0370908 A1 * | 12/2016 | Kim | G06F 3/044 |

(Continued)

FOREIGN PATENT DOCUMENTS

KR      1020170126569      11/2017

*Primary Examiner* — Dong Hui Liang
(74) *Attorney, Agent, or Firm* — F. Chau & Associates, LLC

(57) ABSTRACT

A display device includes a display panel and a printed circuit board (PCB) connected to the display panel. The PCB includes an insulating base. A pressure sensor is disposed to overlap with the display panel. A fingerprint sensor is disposed to overlap with the display panel and is spaced apart, on a first side in a first direction, from the pressure sensor. A first distance from the pressure sensor to a first edge of the insulating base is greater than a second distance from the pressure sensor to a second edge of the insulating base opposite the fingerprint sensor.

21 Claims, 25 Drawing Sheets

(56) References Cited

U.S. PATENT DOCUMENTS

| | | | |
|---|---|---|---|
| 2017/0192596 A1* | 7/2017 | Lee | G01L 1/146 |
| 2017/0287992 A1* | 10/2017 | Kwak | G06F 3/041 |
| 2018/0129333 A1* | 5/2018 | Zheng | G06F 3/0414 |
| 2018/0157411 A1* | 6/2018 | Kim | G06F 3/0488 |
| 2018/0160545 A1* | 6/2018 | Kim | G02F 1/1333 |
| 2018/0293420 A1* | 10/2018 | Kim | H04M 1/0277 |
| 2018/0321780 A1* | 11/2018 | Park | G06F 3/0412 |
| 2019/0130157 A1* | 5/2019 | Oh | G06F 1/1626 |

* cited by examiner

PRINTED CIRCUIT BOARD PACKAGE AND DISPLAY DEVICE INCLUDING THE SAME

CROSS-REFERENCE TO RELATED APPLICATION

This application claims priority under 35 U.S.C. § 119 to Korean Patent Application No. 10-2018-0036272, filed on Mar. 29, 2018, the disclosure of which is incorporated by reference herein in its entirety.

1. TECHNICAL FIELD

Exemplary embodiments of the present invention relate to a printed circuit board (PCB) package, and more particularly, to a display device including the same.

2. DISCUSSION OF RELATED ART

A display device, such as a liquid crystal display (LCD) device, or an organic light-emitting display (OLED) device may include a display panel on which pixels displaying an image are defined and a printed circuit board (PCB) which provide signals driving the display panel.

As an example, a display device may further include a touch sensor capable of sensing touch information of a user. The touch information might not only include information indicating whether a touch is made and the location of the touch, but also may include information indicating whether the touch involves pressure, the pressure of the touch, and the shape of an object with which the touch is made.

The display device including the touch sensor can be applied to a portable electronic device such as a smartphone, a smartwatch, a tablet personal computer (PC), or a notebook computer or a large-size electronic device such as a television (TV), a monitor, or a digital information display.

When a variety of sensors are integrated into a display device, the durability of the display device may be reduced. For example, if various touch sensors fail to be stably supported in the display device, a lot-to-lot sensing distribution may be formed. As a result, the yield of the display device may decrease, or the life of the display device may decrease because of the decrease of sensing sensitivity over the period of use.

SUMMARY

An exemplary embodiment of the present invention provides a display device with increased durability.

An exemplary embodiment of the present invention provides a printed circuit board (PCB) package with increased durability.

According to an exemplary embodiment of the present invention, a display device includes a display panel and a printed circuit board (PCB) connected to the display panel. The PCB includes an insulating base. A pressure sensor is disposed to overlap with the display panel. A fingerprint sensor is disposed to overlap with the display panel and is spaced apart, on a first side in a first direction, from the pressure sensor. A first distance from the pressure sensor to a first edge of the insulating base is greater than a second distance from the pressure sensor to a second edge of the insulating base opposite the fingerprint sensor.

According to an exemplary embodiment of the present invention, a display device includes a display panel and a PCB connected to the display panel. The PCB includes an insulating base and a dummy structure disposed on the insulating base. A pressure sensor is disposed to overlap with the display panel. A fingerprint sensor is disposed to overlap with the display panel. The dummy structure is disposed between the pressure sensor and the fingerprint sensor.

According to an exemplary embodiment of the present invention, a PCB package c includes an insulating base and a pressure sensor disposed on the insulating base. A touch IC is disposed on the insulating base and is electrically connected to the pressure sensor. A first shortest distance from the pressure sensor to a first edge of the insulating base is different from a second distance from the pressure sensor to a second edge of the insulating base opposite the first edge.

According to an exemplary embodiment of the present invention, a PCB package includes a base and a pressure sensor disposed on the base. A dummy structure is disposed on the base. The dummy structure is spaced apart from the pressure sensor. A touch IC is disposed on the base. The touch IC is electrically connected to the pressure sensor. The touch IC is not electrically connected to the dummy structure. The dummy structure is closer to an edge of the base than the pressure sensor.

According to an exemplary embodiment of the present invention, a formation of an undesired sensing distribution or a decrease of sensing sensitivity can be prevented.

BRIEF DESCRIPTION OF THE DRAWINGS

The above and other aspects and features of the present invention will become more apparent by describing in detail exemplary embodiments thereof with reference to the accompanying drawings, in which.

DETAILED DESCRIPTION

Figure 1:
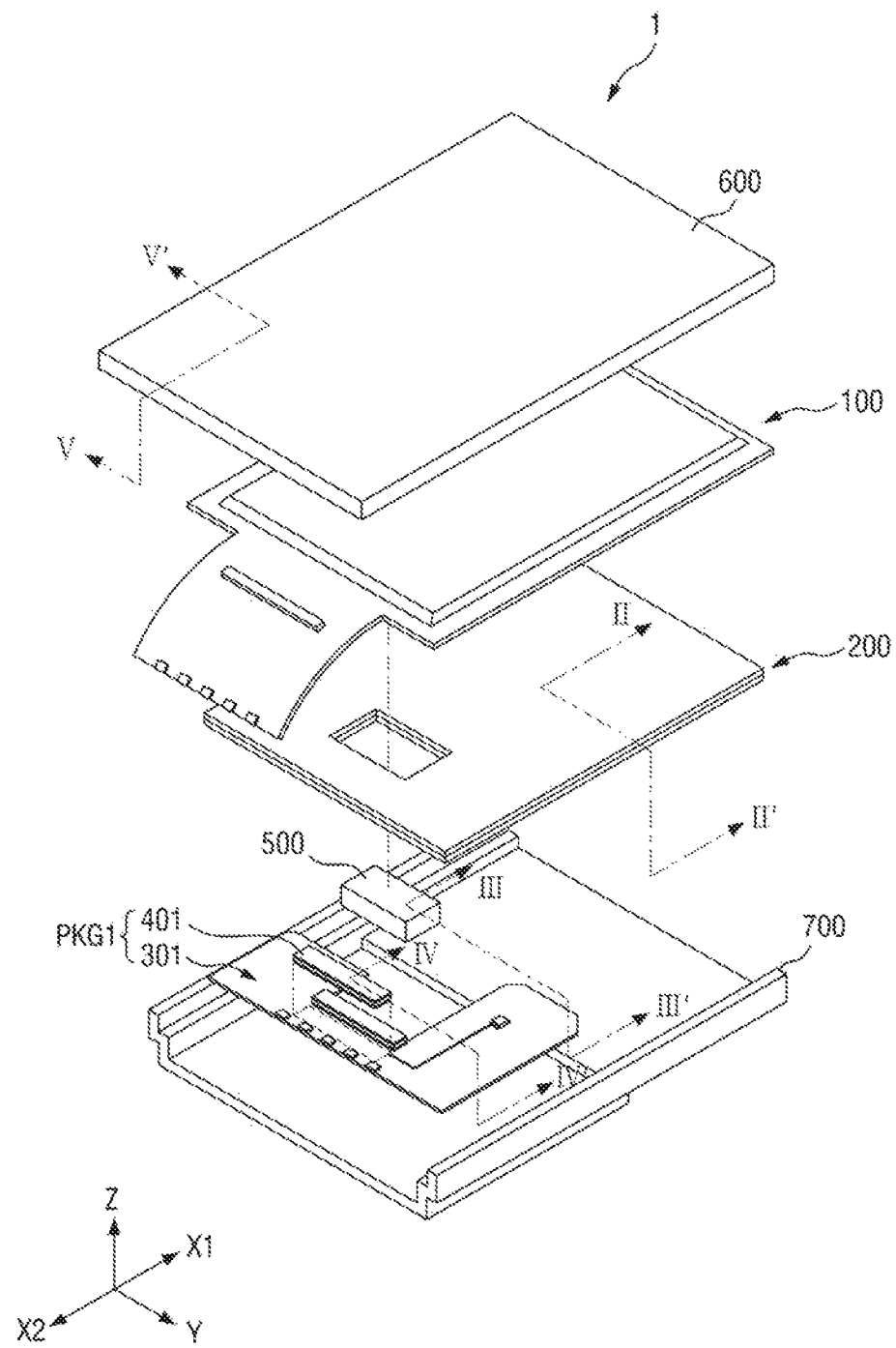
FIG. 1 is an exploded perspective view of a display device according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

As used herein, the singular forms "a", "an" and "the" may include the plural forms as well, unless the context clearly indicates otherwise.

It will be understood that when a component, such as a layer, a film, a region, or a plate, is referred to as being "on" another component, the component may be directly on the other component or intervening components may be present.

It will be understood that although the terms "first" and "second" may be used herein to describe various components, these components should not be limited by these terms.

Herein, a first direction (e.g., directions X1, or X2) may refer to a direction on a plane. For example, directions X1 and X2 extending in opposite directions from each other may define a plane, such as a plan along which an upper surface of the substrate extends. A second direction Y may refer to a direction intersecting the first direction (e.g., X1, or X2). The second direction Y may be perpendicular to directions X1 and X2 and may extend in the same plane as directions X1 and X2. A third direction Z may refer to a direction perpendicular to (e.g., orthogonal to) a plane defined by the first direction (e.g., X1 or X2) and the second direction Y2. The term "overlap" may refer to when elements overlap with one another in the third direction Z in a plan view. As an example, direction X1 may be referred to as a first direction, direction X2 may be referred to as a second direction, direction Y may be referred to as a third direction and direction Z may be referred to as a fourth direction.

Figure 2:
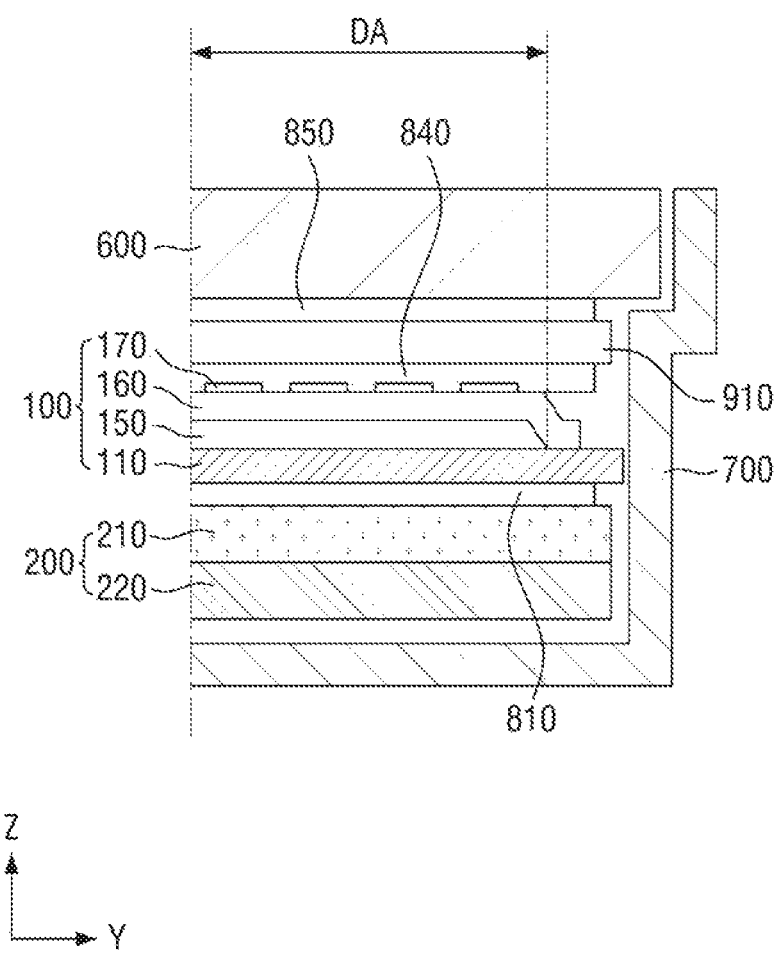
FIG. 2 is a cross-sectional view taken along line II-II' of FIG. 1.
Figure 3:
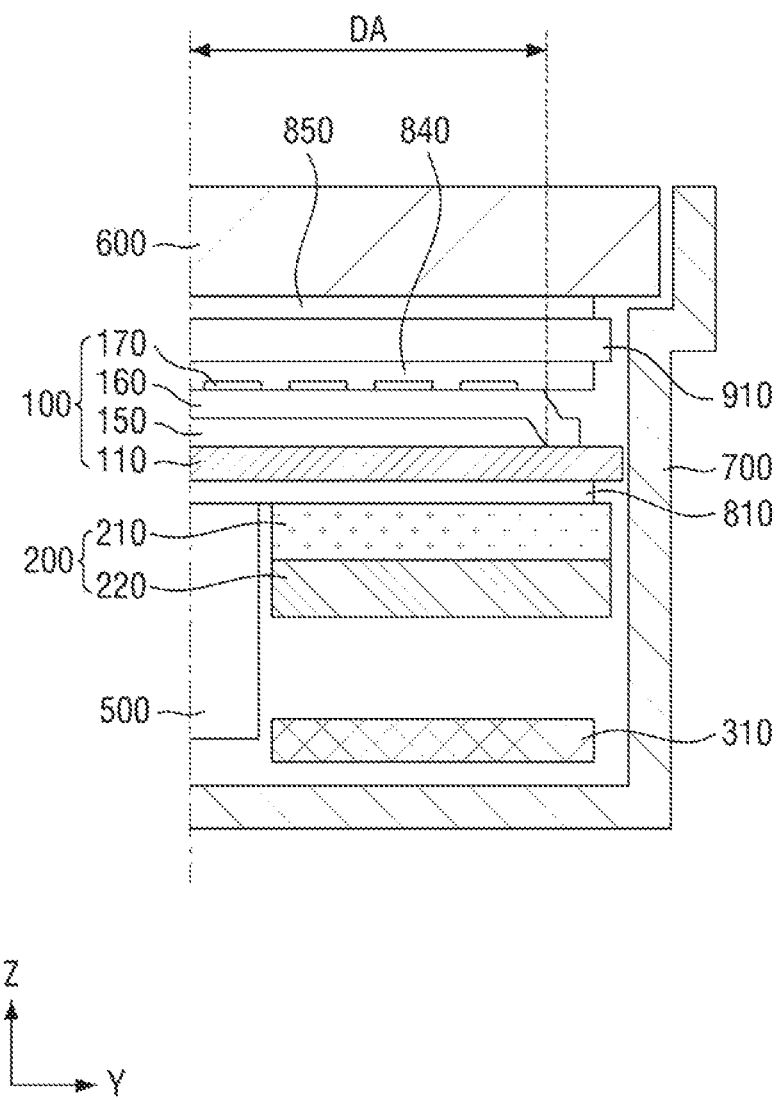
FIG. 3 is a cross-sectional view taken along line III-III' of FIG. 1.
Figure 4:
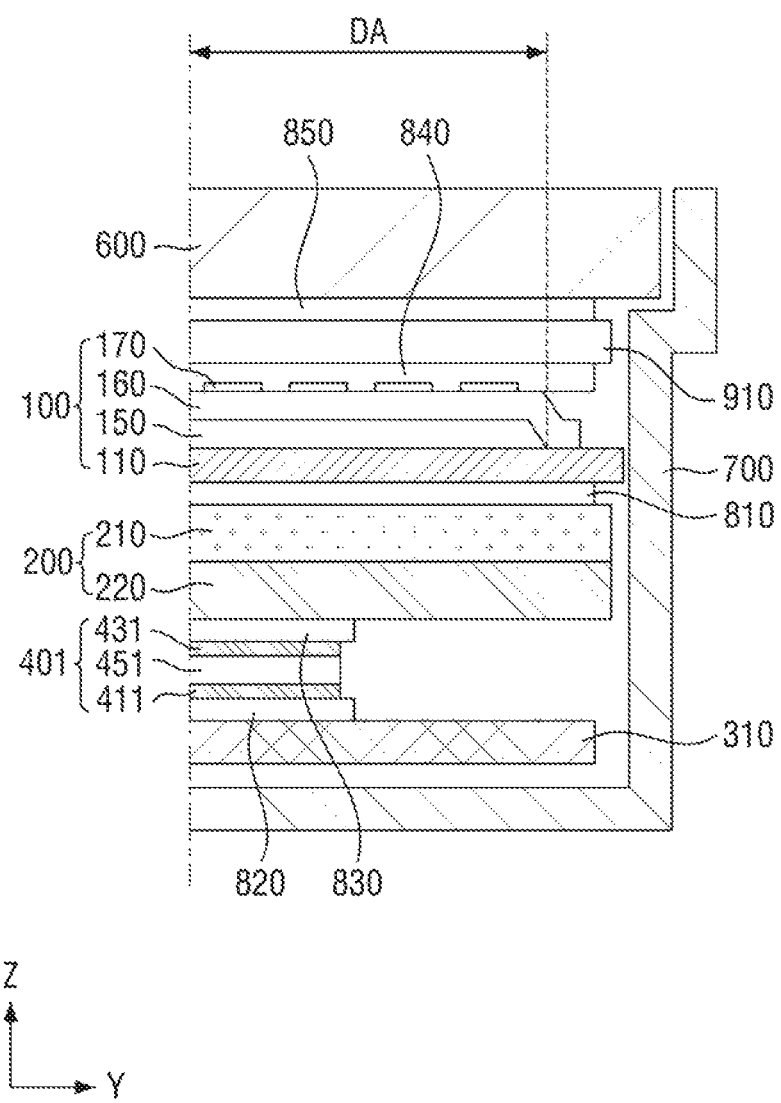
FIG. 4 is a cross-sectional view taken along line IV-IV' of FIG. 1.
Figure 5:
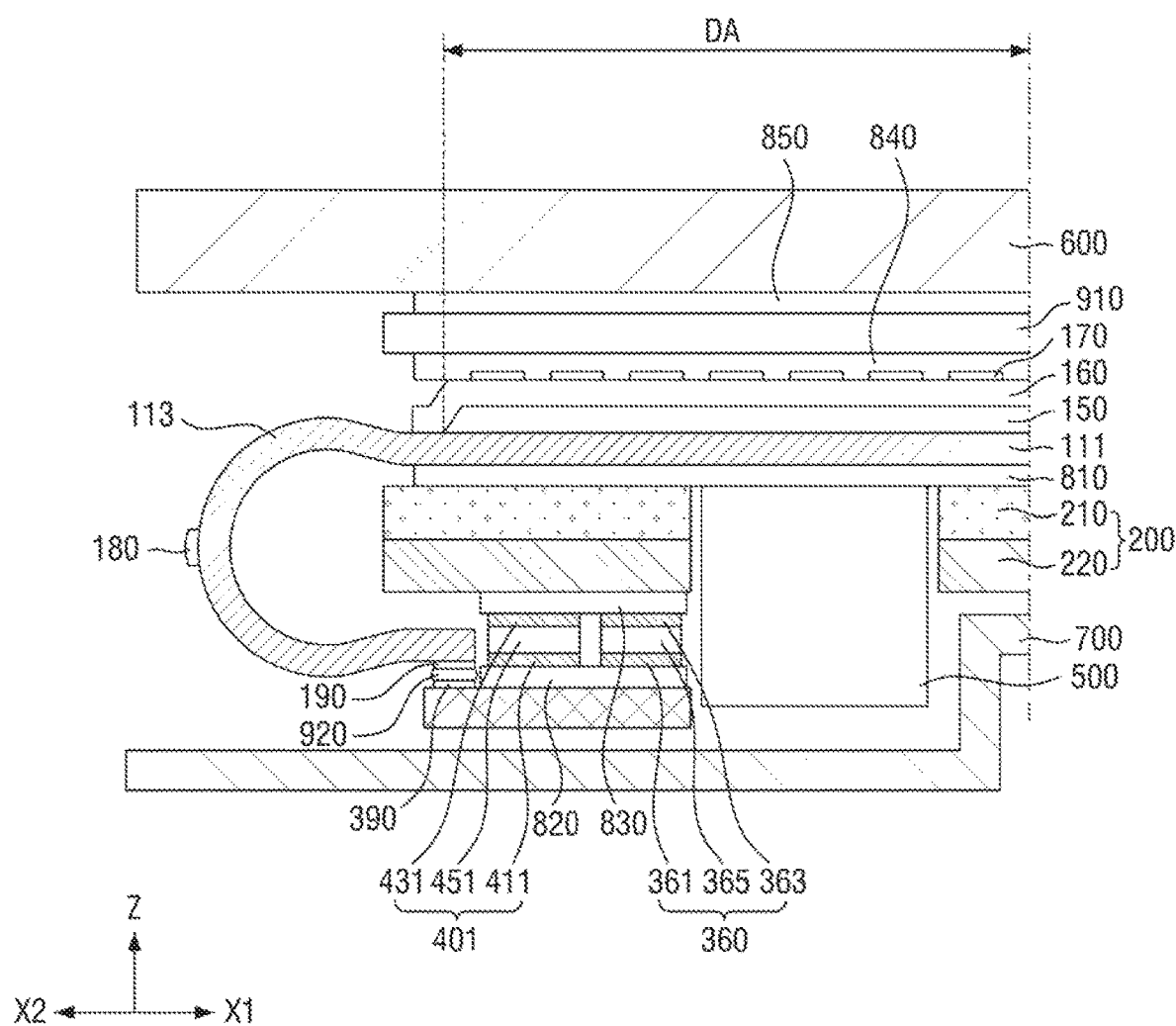
FIG. 5 is a cross-sectional view taken along line V-V' of FIG. 1.

FIG. 1 is an exploded perspective view of a display device according to an exemplary embodiment of the present invention. FIG. 2 is a cross-sectional view taken along line II-II' of FIG. 1. FIG. 3 is a cross-sectional view taken along line III-III' of FIG. 1. FIG. 4 is a cross-sectional view taken along line IV-IV' of FIG. 1. FIG. 5 is a cross-sectional view taken along line V-V' of FIG. 1.

Referring to FIGS. 1 through 5, a display device 1 may include a display panel 100 and a printed circuit board (PCB) package PKG1 and may further include a rear sheet member 200, a fingerprint sensor 500, a window glass 600, and a rear cover 700. The display device 1 may be applicable to various portable electronic devices (e.g., a Smartphone) or relatively large-size electronic devices (e.g., a flat screen television).

The display panel 100 may be a panel-type element capable of displaying an image. For example, the display panel 100 may have a display area DA including a plurality of pixels displaying an image. The display panel 100 and the display area DA may have a shape having a pair of relatively long sides and a pair of relatively short sides in a plan view. Thus, the display panel 100 may have a rectangular or a square shape; however, exemplary embodiments of the present invention are not limited thereto. For example, the display area DA may be longer in the first direction (e.g., X1, X2) than in the second direction Y. The display area DA may be adjacent to a non-display area (e.g., a bezel). The non-display area may be adjacent to four sides of the display area DA in a plan view. Alternatively, the non-display area may be adjacent to less than four sides of the display area DA in a plan view.

Figure 6:
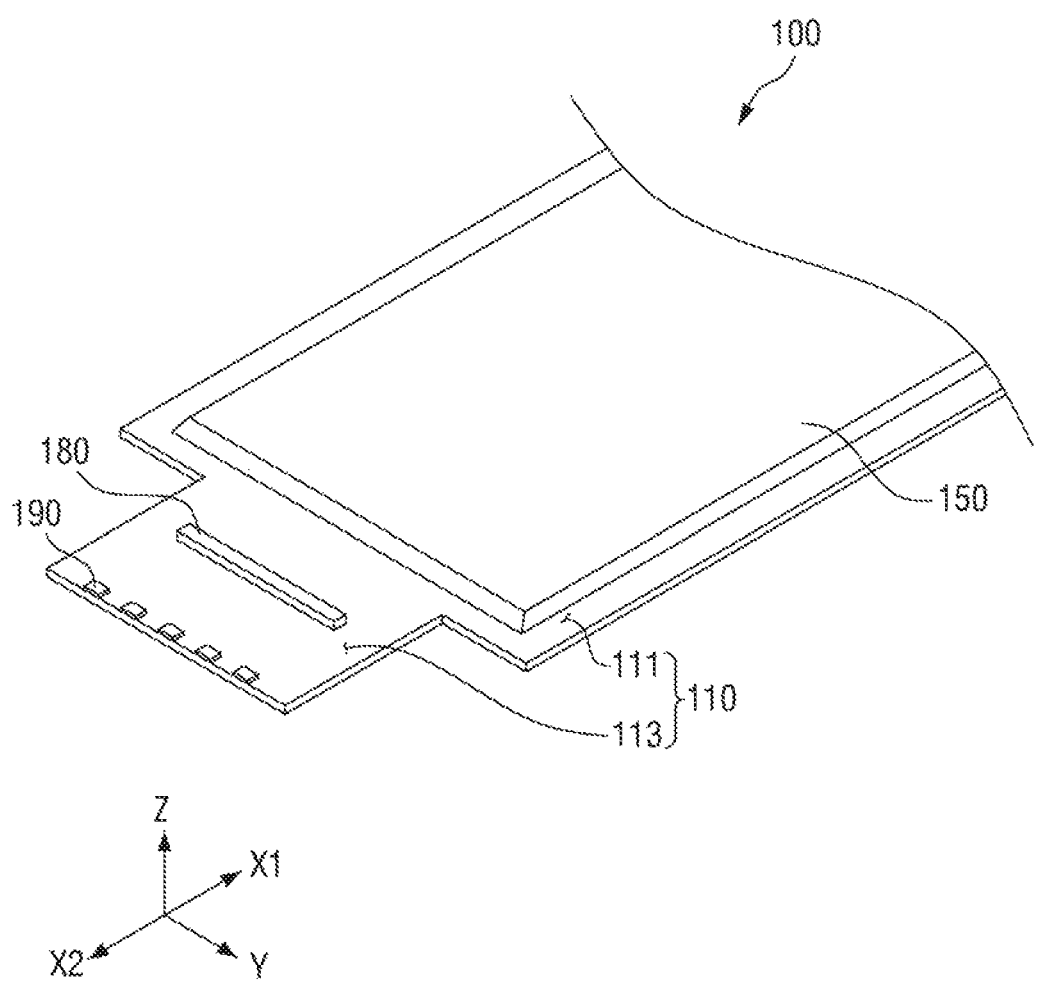
FIG. 6 is a perspective view of a display panel of FIG. 1.
Figure 7:
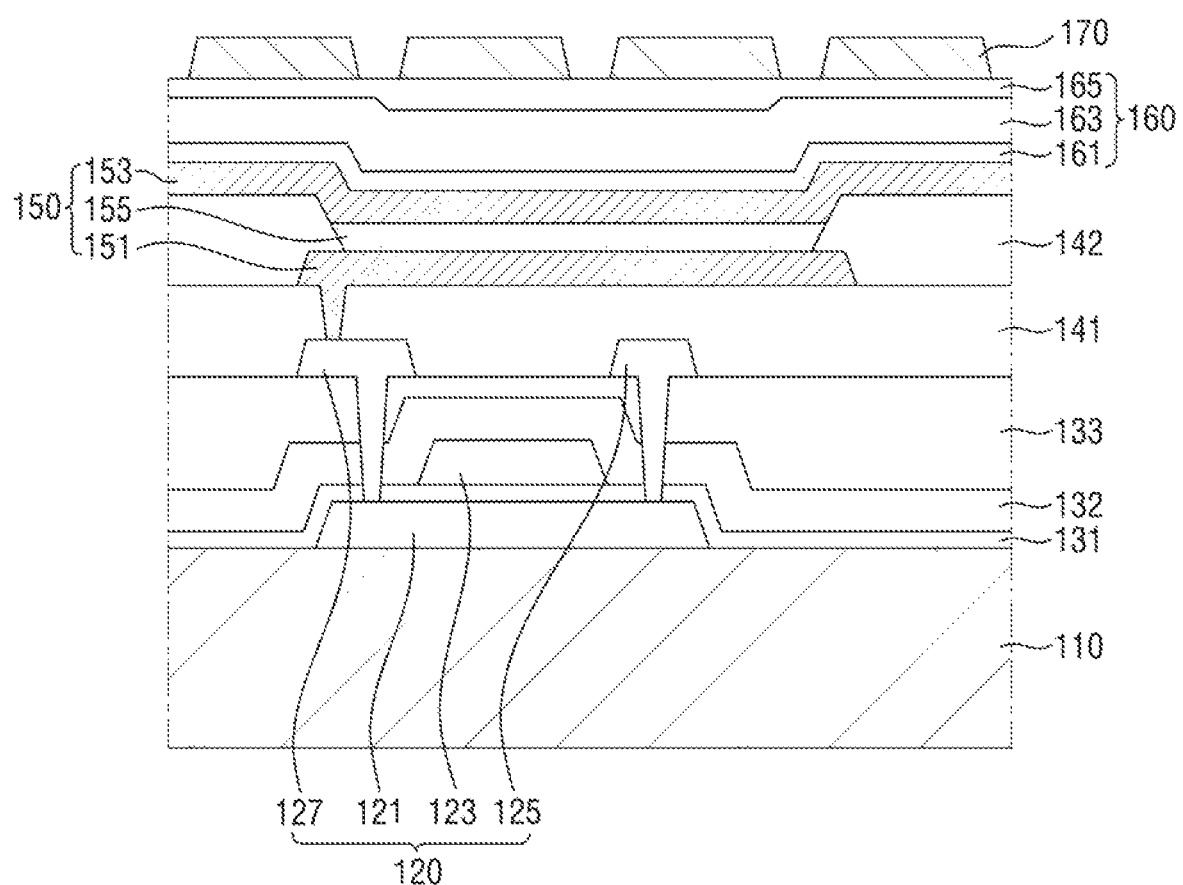
FIG. 7 is a cross-sectional view of an exemplary pixel of the display panel of FIG. 6.

The display panel 100 will be described in more detail below with reference to FIGS. 6 and 7. FIG. 6 is a perspective view of a display panel of FIG. 1. FIG. 7 is a cross-sectional view of an exemplary pixel in the display area DA of the display panel of FIG. 6. FIG. 7 illustrates, for example, a first base 110 of the display panel 100 that is unfolded, rather than bent, however the display panel 100 may be a bendable display panel that may be temporarily or permanently configured in a folded or bent state.

Referring to FIGS. 1 through 7, the display panel 100 may include the first base 110 and a light-emitting element layer 150, a wiring layer, an encapsulation layer 160, and a touch location sensor 170. In an exemplary embodiment of the present invention, the display panel 100 may be an organic light-emitting display panel, but exemplary embodiments of the present invention are not limited thereto. For example, alternatively, the display panel 100 may be a liquid crystal display (LCD) panel.

The first base 110 may be a transparent or opaque supporting member providing a space in which the wiring layer and the light-emitting element layer 150 may be arranged. The first base 110 may include an insulating film or plate. The first base 110 may be flexible. For example, the first base 110 may be foldable or bendable and may be temporarily or permanently in a folded, curved or bent state; however, the first base 110 may also be in a substantially flat state during at least some periods of time. As an example, the first base 110 may include a glass material or a quartz material or may include a polymer material such as polyimide (PI), polycarbonate (PC), polyethylene terephthalate (PET), or polyacrylate (PA).

The first base 110 may include a light-emitting element layer supporting portion 111, which provides a space for arranging the light-emitting element layer 150, and a driver integrated circuit (IC) supporting portion 113, which protrudes from the light-emitting element layer supporting portion 111 and in which a driver IC 180 is disposed. FIG. 6 illustrates the first base 110 as being in an unfolded state, but the driver IC supporting portion 113 of the first base 110 may be partially bent. For example, the driver IC supporting portion 113 may be bent at least partially along the first direction (e.g., X1, X2) and may thus be located at the rear of the light-emitting element layer supporting portion 111 when assembled into the display device 1. In an exemplary embodiment of the present invention, the light-emitting element supporting portion 111 may be bent at least partially in the second direction Y. Thus, the display device 1 may be a curved display device.

The wiring layer, which may include a thin-film transistor 120 (TFT) and wires providing driving signals to the TFT 120, may be disposed on the light-emitting element layer supporting portion 111 of the first base 110. The TFT 120 may include an active layer 121, which forms a channel, a gate electrode 123, which is a control terminal, a drain electrode 125, which is an input terminal, and a source electrode 127, which is an output terminal. The TFT 120 may be a driving transistor controlling the amount of light emitted by the light-emitting element layer 150 in a particular pixel by controlling the amount of current that flows through the channel region of the active layer 121. The active layer 121 of the TFT 120 may be in direct contact with an upper surface of the first base 110 facing the TFT 120. As an example, the gate electrode 123 may be electrically connected to the output terminal of a switching transistor, which controls the turning on or off of the particular pixel, and may thus be provided with a control signal, and the drain electrode 125 may be electrically connected to a driving voltage line and may thus be provided with a driving voltage. A first insulating layer 131 may be disposed between the active layer 121 and the gate electrode 123, and a plurality of insulating layers, including second and third insulating layers 132 and 133, may be disposed between the gate electrode 123, the drain electrode 125, and the source electrode 127. The first, second, and third insulating layers 131, 132, and 133 may include at least one of silicon nitride, silicon oxide, silicon oxynitride, or silicon nitrogen oxide.

A height difference compensating layer 141 may be disposed on the TFT 120. The height difference compensating layer 141 may minimize height differences formed by the elements disposed on the first base 110 and may thus provide a space for stably arranging the light-emitting element layer 150. An upper surface of the height difference compensating layer 141 facing away from the first base 110 may be substantially flat, and may extend along a plane defined by a first direction X1, a second direction X2 opposite the first direction X1 and a third direction Y perpendicular to the first and second directions X1 and X2. A material included in the height difference compensating layer 141 is not particularly limited as long as it has an insulating property and a height difference compensating property. For example, the height difference compensating layer 141 may include an organic material such as an acrylic resin, an epoxy resin, an imide resin, a caldo resin, or an ester resin.

The light-emitting element layer 150 may be disposed on the height difference compensating layer 141. The light-emitting element layer 150 may be in direct contact with the upper surface of the height difference compensating layer 141. The light-emitting element layer 150 may form the display area DA in which an image is displayed. In an exemplary embodiment of the present invention, the light-emitting element layer 150 may be an organic light-emitting element including an anode electrode 151 and a cathode electrode 153 facing each other and an organic light-emitting layer 155 disposed between the anode electrode 151 and the cathode electrode 153. The anode electrode 151 may be electrically connected to the source electrode 127 of the TFT 120. The anode electrode 151 may be a pixel electrode which is disposed in each pixel and to which an independent signal is applied, and the cathode electrode 153 may be a common electrode which is disposed across a plurality of pixels. The anode electrode 151 and the cathode electrode 153 may each be transparent or opaque. A corresponding organic light-emitting layer 155 may be respectively disposed in each pixel. For example, the organic light-emitting layer 155 may emit phosphorescent or fluorescent blue light, phosphorescent or fluorescent green light, phosphorescent or fluorescent red light, or white light. As an example, a functional layer such as a hole control layer, an electron control layer, or a charge generating layer may be disposed between the anode electrode 151 and the cathode electrode 153 to increase the luminous efficiency of the organic light-emitting layer 155. In an exemplary embodiment of the present invention, a pixel defining layer 142 may be disposed on the anode electrode 151. The pixel defining layer 142 may be in direct contact with side surfaces of the light-emitting element layer 150, and may also be in direct contact with a portion of the upper surface of the height difference compensating layer 141 not covered by the light-emitting element layer 150. The pixel defining layer 142 may define each pixel. The pixel defining layer 142 may have an opening partially exposing the surface of the anode electrode 151, and the organic light-emitting layer 155 and the cathode electrode 153 may be disposed on the pixel defining layer 142. The pixel defining layer 142 may include an organic material such as an acrylic resin, an epoxy resin, an imide resin, or an ester resin.

The encapsulation layer 160 may be disposed on the light-emitting element layer 150. For example, the encapsulation layer 160 may be in direct contact with an upper surface of the light-emitting element layer 150 facing away from the first base 110. The encapsulation layer 160 may prevent the organic light-emitting layer 155 of the light-emitting element layer 150 from being damaged or deformed by the penetration of moisture or air from outside the display device 1. In an exemplary embodiment of the present invention, the encapsulation layer 160 may include at least one inorganic encapsulation layer, such as at least one of first and second inorganic encapsulation layers 161 or 165, and at least one organic encapsulation layer, such as an organic encapsulation layer 163. For example, the at least one inorganic encapsulation layer and the at least one organic encapsulation layer may be alternately stacked. The encapsulation layer 160 may include three layers (see, e.g., FIG. 7), but exemplary embodiments of the present invention are not limited thereto. In an exemplary embodiment of the present invention, the uppermost and lowermost layers of the encapsulation layer 160 may be the first and second inorganic encapsulation layers 161 and 165, respectively, which include an inorganic material. For example, the first inorganic encapsulation layer 161 may be in direct contact with the cathode electrode 153, and the second inorganic encapsulation layer 165 may be in direct contact with the touch location sensor 170. The first and second inorganic encapsulation layers 161 and 165 may each include silicon nitride, silicon oxide, silicon oxynitride, or silicon nitrogen oxide.

The touch location sensor 170 may be disposed on the second inorganic encapsulation layer 165. For example, the touch location sensor 170 may be disposed directly on the encapsulation layer 160. For example, the touch location sensor 170 may be in direct contact with an upper surface of the second inorganic encapsulation layer 165 facing away from the first base 110. The touch location sensor 170 may include a plurality of sensors spaced apart from each other (e.g., arranged in a matrix configuration). The touch location sensor 170 may be configured to acquire touch location information regarding the user's touch operation. For example, the touch location sensor 170 may include a plurality of electrodes spaced apart from one another and may acquire touch location coordinates in a self-capacitance-type method or a mutual capacitance-type method. The touch location sensor 170 of the display panel 100 may be electrically connected to a touch IC of a PCB 301.

The driver IC 180 may be disposed on the driver IC supporting portion 113 of the first base 110. The driver IC 180 may be disposed on a convex surface of the first base 110 when the driver IC supporting portion 113 of the first base 110 is bent in the first direction (e.g., X1, X2). For example, the driving IC may be disposed on a side of the driver IC supporting portion 113 facing away from the display area DA when the driver IC supporting portion 113 is in a bent state. The driver IC 180 may generate or modulate an image signal for the display of an image by the display panel 100 based on driving signals provided by an external driver element, for example, the PCB 301, and may then transmit or provide the generated or modulated image signal to the TFT 120.

As an example, the first base 110 of the display panel 100 may be bent in the first direction (e.g., X1, X2) and thus may form the driver IC supporting portion 113 (see, e.g., FIG. 5), but exemplary embodiments of the present invention are not limited thereto. As an example, the display panel 100 may further include a chip-on-film package electrically connecting the PCB 301 and the TFT 120, and the chip-on-film package may form a driver IC supporting portion bent in the first direction (e.g., X1, X2).

In an exemplary embodiment of the present invention, the light-emitting element layer 150 might overlap the light-emitting element layer supporting portion 111 in a plan view, but might not overlap the driver IC supporting portion 113 in a plan view.

In an exemplary embodiment of the present invention, display panel pads (which may be referred to herein as first pads) 190 may be disposed on the driver IC supporting portion 113 of the first base 110. The display panel pads 190 may electrically connect the display panel 100 and the PCB 301. The display panel pads 190 may be spaced apart from each other in the Y direction perpendicular to directions X1 and X2. The display panel pads 190 may be spaced apart from the driver IC in the X1 or X2 direction. As an example, the display panel pads 190 may be formed by separate electrodes having an expanded area (see, e.g., FIG. 5), but exemplary embodiments of the present invention are not limited thereto. As an, the display panel pads 190 may form pads for electrical connection by expanding the ends of wires.

As an example, wires electrically connecting the driver IC 180 and the TFT 120 and wires electrically connecting the driver IC 180 and the display panel pads 190 may be further disposed on the first base 110, and the TFT 120, the driver IC 180, and the display panel pads 190 may be electrically connected to one another.

In an exemplary embodiment of the present invention, a rear sheet element 200 may be disposed on the rear surface of the display panel 100. The terms "rear sheet element" and "rear sheet member" may be used interchangeably herein. The rear sheet element 200 may overlap with the display area DA of the display panel 100 in the third direction Z. In an exemplary embodiment of the present invention, the rear sheet element 200 may include a cushion sheet element 210 and a metal sheet element 220. As an example, the rear sheet element 200 may include a stack of two sheets, but exemplary embodiments of the present invention are not limited thereto.

For example, a cushion sheet member 210 may form an uppermost layer of the rear sheet member 200. The terms "cushion sheet element" and "cushion sheet member" may be used interchangeably herein. The cushion sheet member 210 may reduce or eliminate damage caused by external impact to the display panel 100. The cushion sheet member 210 may absorb or distribute at least part of external impact and may thus protect the display panel 100. The material of the cushion sheet member 210 is not particularly limited as long as it is suitable for absorbing and/or distributing impact. For example, the cushion sheet member 210 may include a polymer material such as a urethane-based resin, a carbonate-based resin, a propylene-based resin, or an ethylene-based resin, a rubber-based material, or a foamed product thereof.

A metal sheet member 220 may form a lowermost layer of the rear sheet member 200. The terms "metal sheet element" and "metal sheet member" may be used interchangeably herein. The metal sheet member 220 may increase the strength of the display device 1 or may have a heat dissipation function and/or an electromagnetic shielding function. The material of the metal sheet member 220 is not particularly limited as long as it has a predetermined rigidity and strength and has heat transmission and electromagnetic shielding functions. For example, the metal sheet member 220 may include copper (Cu), nickel (Ni), ferrite, silver (Ag), or an alloy thereof.

In an exemplary embodiment of the present invention, the cushion sheet member 210 and the metal sheet member 220 may include a fingerprint sensor insertion hole in which the fingerprint sensor 500 that will be described in more detail below is inserted. As an example, an upper surface of the fingerprint sensor 500 may be substantially aligned with an upper surface of the cushion sheet member 210 (e.g., along the plane defined by directions X1, X2 and Y). As an example, in a plan view, the rear sheet member 200, which includes the cushion sheet member 210 and the metal sheet member 220, may be disposed not to overlap with the fingerprint sensor 500. For example, the rear sheet member may be configured (e.g., dimensioned, shaped and positioned) to expose the fingerprint sensor 500. The sensing sensitivity of the fingerprint sensor 500 may be increased by not disposed the rear sheet member 200 between the display panel 100 and the fingerprint sensor 500.

The display panel 100 and the rear sheet member 200 may be coupled to each other by disposing a first bonding layer 810 therebetween. For example, the first base 110 of the display panel 100 and the cushion sheet member 210 of the rear sheet member 200 may be coupled to each other by being respectively in direct contact with the first bonding layer 810 (e.g., with opposite sides of the first bonding layer 810). The first bonding layer 810 may include an optically clear adhesive (OCA), an optically clear resin (OCR), or a pressure sensitive adhesive (PSA). In a case where the rear sheet member 200 includes the fingerprint sensor insertion hole, the first bonding layer 810 may couple the display panel 100 and the fingerprint sensor 500 to each other.

The PCB package PKG1, which includes the PCB 301 and a pressure sensor 401, may be disposed on the rear surface of the rear sheet member 200. The fingerprint sensor 500 may also be disposed on the rear surface of the display panel 100. The PCB 301 and the pressure sensor 401 may be coupled to each other by disposing a second bonding layer 820 therebetween, and the pressure sensor 401 and the rear sheet member 200 may be coupled to each other by disposing a third bonding layer 830 therebetween. The second and third bonding layers 820 and 830 may include an OCA, an OCR, or a PSA.

In an exemplary embodiment of the present invention, the PCB 301 and the pressure sensor 401 may be disposed to at least partially overlap with the rear sheet member 200 in the third direction Z, and the fingerprint sensor 500 may be disposed not to overlap with the rear sheet member 200 in the third direction Z. The PCB package PKG1 and the fingerprint sensor 500 will be described in more detail below.

According to an exemplary embodiment of the present invention, the fingerprint sensor 500 may be exposed through an opening (e.g., the fingerprint sensor insertion hole described in more detail above) in the rear sheet member 200. The opening may have a square or rectangular shape (e.g., in a plan view); however, exemplary embodiments of the present invention are not limited thereto. For example, the opening may have a circular or oval shape (e.g., in a plan view). The PCB package PKG1 may be spaced apart from the opening in the rear sheet member 200, and thus the PCB package PKG1 might not be exposed through the opening in the rear sheet member 200.

A window glass 600 may be disposed on the front surface of the display panel 100. The window glass 600 may protect the display panel 100 and form the exterior of the display device 1 by covering the top surface of the display panel 100. In a case where the display panel 100 is partially bent, the window glass 600 may also be partially bent along with the display panel 100, in which case, the display device 1 may be a curved display device. The window glass 600 may form a display surface on which an image is displayed by the display device 1, and may also form a touch surface where the user's touch operation, for example the contact between the user and the display device 1, occurs. The material of the window glass 600 is not particularly limited as long as it has relatively high light transmittance and relatively high strength. For example, the window glass 600 may include a glass, sapphire, or polymer plate.

In an exemplary embodiment of the present invention, a polarizing member 910 may be disposed between the display panel 100 and the window glass 600. The polarizing member 910 may increase the outdoor visibility of the display device 1. For example, the polarizing member 910 may minimize reflected light from an external light source from being viewed by the user by circularly polarizing non-polarized external incident light and preventing the circularly polarized light from being reflected and emitted again. The polarizing member 910 may include a single layer (see, e.g., FIG. 2). Alternatively, the polarizing member 910 may have a stack of a linearly polarizing member and a phase retarder member. The display panel 100 and the polarizing member 910 may be coupled to each other by disposing a fourth bonding layer 840 therebetween. For example, the touch location sensor 170 of the display panel 100 and the polarizing member 910 may be coupled to each other by being respectively placed in direct contact with the fourth bonding layer 840 (e.g., with opposite sides of the fourth bonding layer 840). The polarizing member 910 and the window glass 600 may be coupled to each other by disposing a fifth bonding layer 850 therebetween. The fourth and fifth bonding layers 840 and 850 may include an OCA, an OCR, or a PSA.

A rear cover 700 may be disposed on the rear surface of the PCB package PKG1. The rear cover 700 may be configured to receive the display panel 100, the PCB package PKG1, which includes the PCB 301 and the pressure sensor 401, and the fingerprint sensor 500. For example, the rear cover 700 may substantially cover and protect the elements of the display device 1 together with the window glass 600. The rear cover 700 may include a material with relatively high strength and rigidity such as a polymer material or a metal material. For example, the rear cover 700 may include a metal material such as aluminum (Al), Ni, or an alloy thereof.

In an exemplary embodiment of the present invention, the PCB 301 and the rear cover 700 may be spaced apart from each other with an air layer therebetween. The PCB 301 may be coupled to the display panel 100 via the first, second, and third bonding layers 810, 820, and 830, but exemplary embodiments of the present invention are not limited thereto. If the PCB 301 and the rear cover 700 are in direct contact with each other, external impact applied to the rear cover 700 may be directly delivered to the display panel 100 via the PCB 301, thus causing damage to the display panel 100, or due to the external impact, interference may occur between the PCB 301 and the rear cover 700, thus causing damage to the PCB 301. In the display device 1 according to an exemplary embodiment of the present invention, however, the PCB 301 and the rear cover 700 may be spaced apart from each other, and as a result, damage caused by external impact to the display panel 100 and/or the PCB 301 can be reduced or eliminated.

Figure 8:
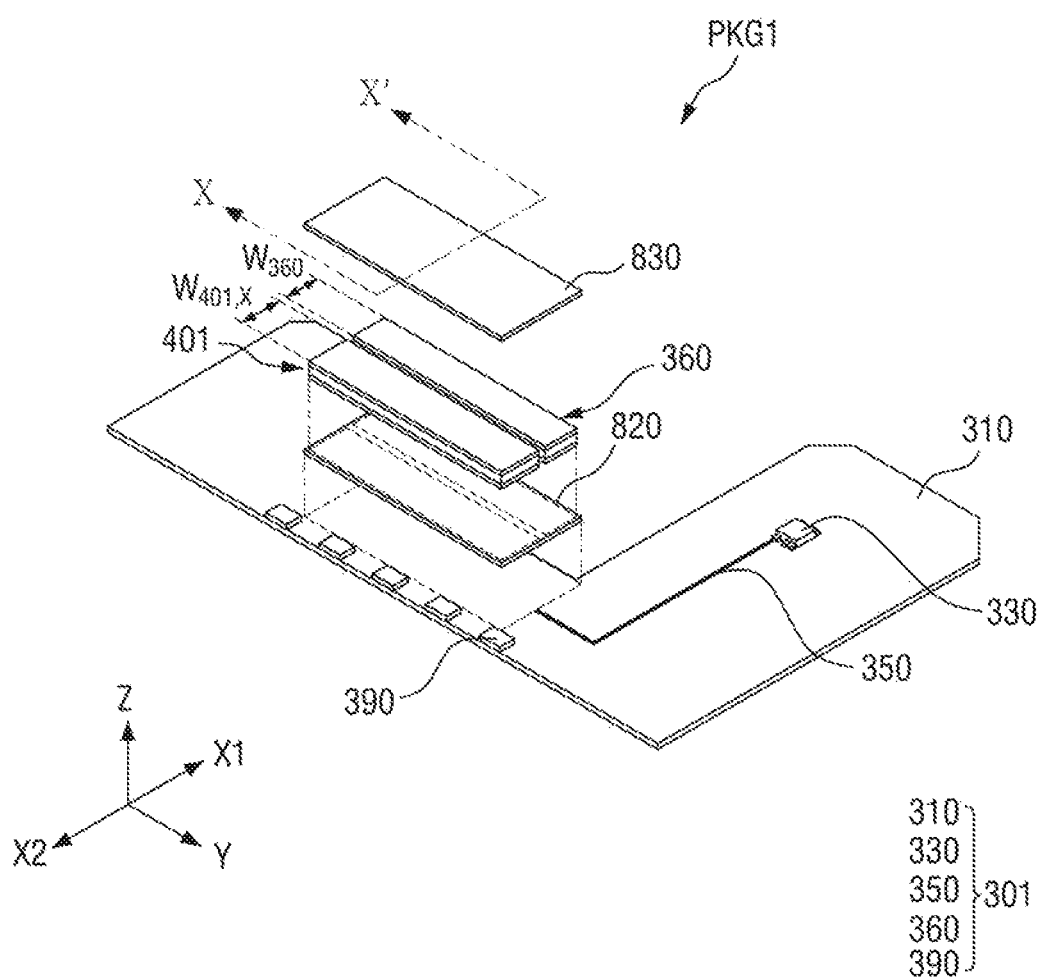
FIG. 8 is an exploded perspective view of a printed circuit board (PCB) package of FIG. 1.
Figure 9:
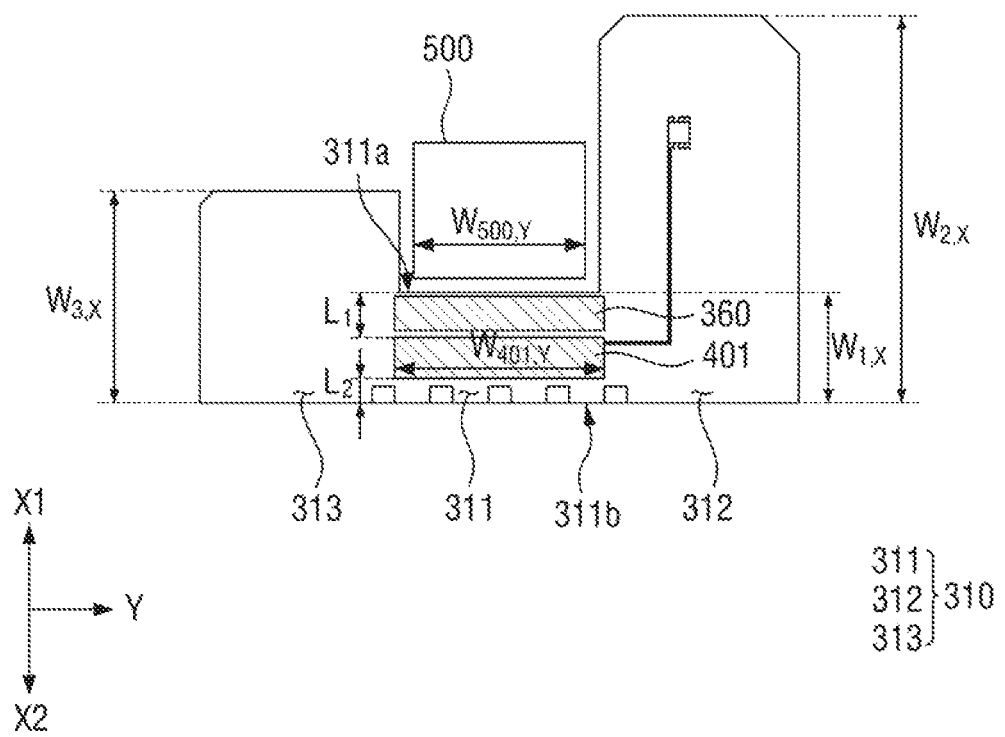
FIG. 9 is a plan view of a PCB package and a fingerprint sensor of FIG. 1.
Figure 10:
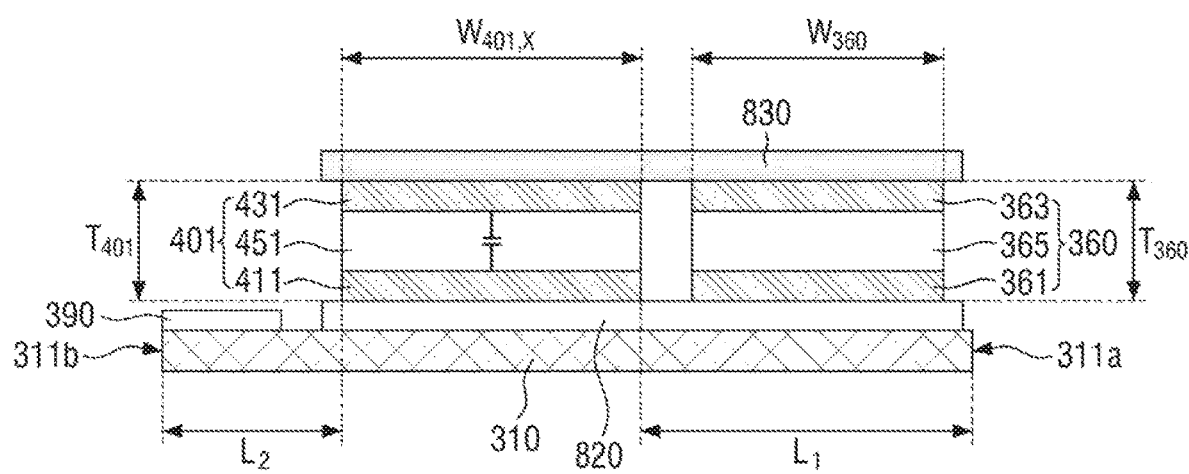
FIG. 10 is a cross-sectional view taken along line X-X' of FIG. 8.
Figure 11:
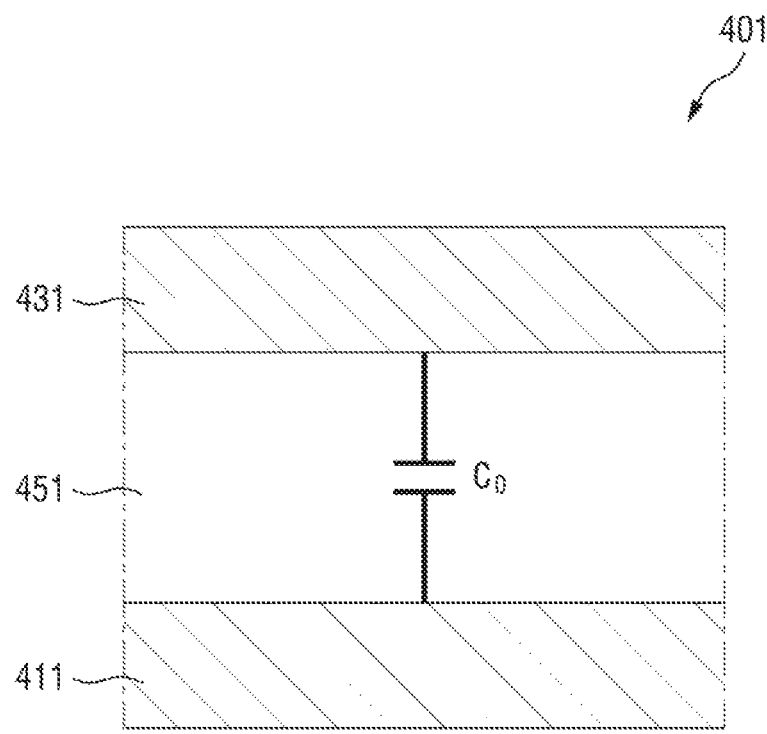
FIGS. 11 and 12 are schematic views of a pressure sensor of FIG. 10.
Figure 12:
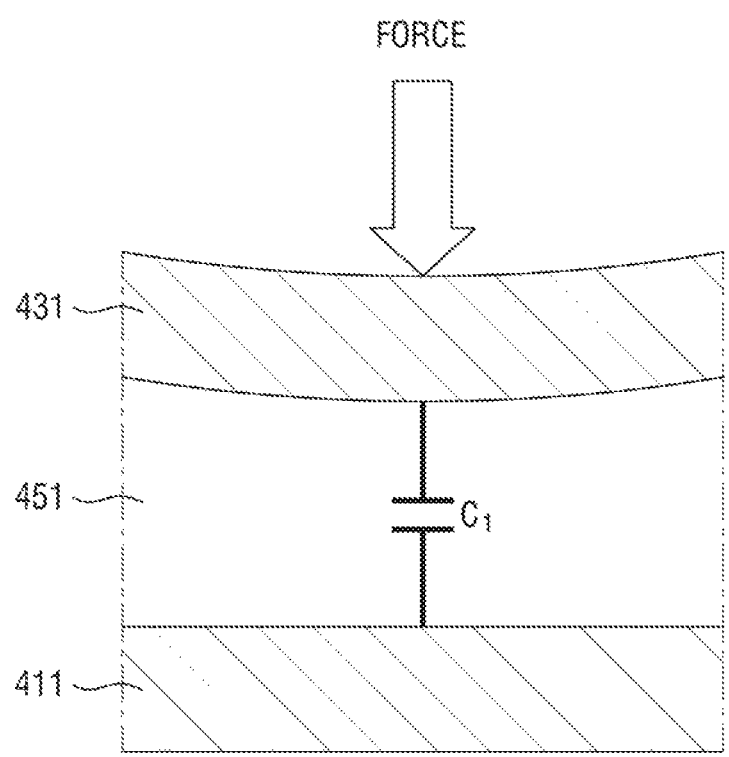
Figure 13:
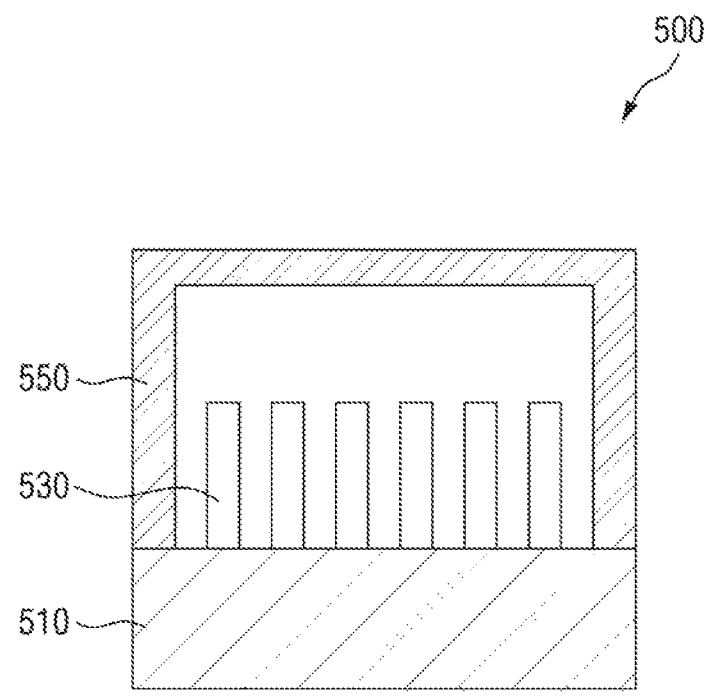
FIG. 13 is a cross-sectional view of the fingerprint sensor of FIG. 9.

The PCB package PKG1 and the fingerprint sensor 500 will be described in more detail below with reference to FIGS. 8 through 13. FIG. 8 is an exploded perspective view of the PCB package of FIG. 1. FIG. 9 is a plan view of a PCB package and a fingerprint sensor of FIG. 1. FIG. 10 is a cross-sectional view taken along line X-X' of FIG. 8. FIGS. 11 and 12 are schematic views of a pressure sensor of FIG. 10. For example, FIG. 11 is a schematic view showing the pressure sensor 401 of FIG. 8 in its initial state with pressure yet to be applied thereto, and FIG. 12 is a schematic view showing the pressure sensor 401 of FIG. 8 in its pressurized state with pressure applied thereto. FIG. 13 is a cross-sectional view of the fingerprint sensor of FIG. 9.

Referring to FIGS. 1 through 13, the PCB package PKG1 may include the PCB 301 and the pressure sensor 401. The PCB package PKG1 may include the second bonding layer 820 and/or the third bonding layer 830. The PCB package PKG1 may be disposed on a rear surface of the display panel 100, for example, on the rear surface of the rear sheet member 200. For example, the PCB package PDG1 may be in direct contact with the rear surface of the rear sheet member 200 facing the rear cover 700.

The PCB 301 may generate or modulate an image signal for the display of an image by the display panel 100 and may then transmit or provide the generated or modulated image signal to the display panel 100. In an exemplary embodiment of the present invention, the PCB 301 may include a second base 310, conductive wires disposed on the second base 310, the touch IC 330 disposed on the second base 310, and PCB pads (which may be referred to as second pads) 390 disposed on the second base 310.

The second base 310 may be a transparent or opaque supporting member providing a space in which the touch IC 330 and conductive wires are to be arranged. The second base 310 may include an insulating film or plate. For example, the first base 100 may include an insulating material. Thus, the second base 310 may be referred to as an "insulating base." The second base 310 may be flexible. For example, the second base 310 may include a polymer material such as PI, polyepoxy, or polyester (PS).

In an exemplary embodiment of the present invention, the second base 310 may include a first portion 311 having a first width $W_{1,x}$ in the first direction (e.g., X1, X2), a second portion 312 having a second width $W_{2,x}$, which is greater than the first width $W_{1,x}$ in the first direction (e.g., X1, X2), and a third portion 313 having a third width $W_{3,x}$, which is greater than the first width $W_{1,x}$ in the first direction (e.g., X1, X2). The second and third portions 312 and 313 may be spaced apart from each other with the first portion 311 disposed therebetween. In a plan view, in a case where the first, second, and third portions 311, 312, and 313 of the second base 310 are aligned along a second edge extending along direction Y, the first, second, and third portions 311, 312, and 313 of the second base 310 might not be aligned along a first edge 311a opposite the second edge 311b. For example, the first edge 311a of the first portion 311 the second base 310 may be recessed in second direction X2 in a plan view.

Conductive wires may be disposed on the second base 310. The conductive wires may electrically connect the PCB pads 390 and elements for driving the display device 1. For example, the conductive wires may include a pressure sensor wire 350 electrically connecting the pressure sensor 401 and the touch IC 330 to each other. The touch IC 330 may be electrically connected to the pressure sensor 401 and the touch location sensor 170 of the display panel 100.

The PCB pads 390 may be disposed adjacent to the second edge 311b of the second base 310. For example, the PCB pad 390 may be disposed between the second edge 311b of the second base 310 and the pressure sensor 401. The PCB pads may be spaced apart from the second edge 311b and may also be spaced apart from the pressure sensor 401 positioned at an opposite side of the PCB pads 390 from the second edge 311b. A plurality of PCB pads 390 may be spaced apart from one another in the second direction Y. The PCB pads 390 may electrically connect the PCB 301 and the display panel 100. For example, the PCB pads 390 may be connected to the display panel pads 190 via an anisotropic conductive film 920. As an example, the PCB pads 390 may be formed by separate electrodes having an expanded area (see, e.g., FIG. 8), but exemplary embodiments of the present invention are not limited thereto. As an example, the PCB pads 390 may form pads for electrical connection by expanding the ends of wires.

The pressure sensor 401 may be disposed on the second base 310 of the PCB 301 and may form the PCB package PKG1 together with the PCB 301. The second bonding layer 820 may be disposed between the pressure sensor 401 and the second base 310, and the third bonding layer 830 may be disposed on the pressure sensor 401, thus forming the PCB package PKG1.

The pressure sensor 401 may be configured to acquire touch pressure information regarding the user's touch operation. For example, the pressure sensor 401 may acquire information indicating whether the user's touch operation involves pressure. In a non-limiting example, the pressure sensor 401 might not acquire information regarding the magnitude of touch pressure.

The pressure sensor 401 may at least partially overlap with the display panel 100 in the third direction Z. For example, the pressure sensor 401 may be disposed at least partially within the display area DA of the display panel 100. By disposing the pressure sensor 401, which acquires touch pressure information of the user, within the display area DA, a touch sensing function can be imparted to at least part of a region for displaying an image, and the interaction between the user and the display device 1 can be increased, which may enable intuitive manipulation of the display device 1. The pressure sensor 401 may at least partially overlap with the rear sheet member 200 in the third direction Z.

In an exemplary embodiment of the present invention, the pressure sensor 401 may include a first electrode 411 having conductivity, a second electrode 431 spaced apart from the first electrode 411 and having conductivity, and an elastic layer 451 disposed between the first and second electrodes 411 and 431. A lower surface of the elastic layer 451 may be in direct contact with an upper surface of the first electrode, and a lower surface of the second electrode may be in direct contact with an upper surface of the elastic layer 451. At least one of the first and second electrodes 411 and 431 may be grounded. The elastic layer 451 may be compressed in response to pressure being applied thereto and may return to its original shape in response to the pressure being eliminated. For example, the distance between the first and second electrodes 411 and 431 of the pressure sensor 401 may vary depending on the presence and/or the location of pressure applied to the pressure sensor 401, and/or the magnitude of the pressure.

The first and second electrodes 411 and 431 and the elastic layer 451 disposed therebetween may form a capacitor. The magnitude of capacitance generated between the first and second electrodes 411 and 431 may be determined by the distance between the first and second electrodes 411 and 431 and the permittivity of the elastic layer 451 disposed between the first and second electrodes 411 and 431. For example, in an initial state where pressure is yet to be applied to the pressure sensor 401, initial capacitance $C_0$ may be generated between the first and second electrodes 411 and 431. On the other hand, in a pressurized state where pressure is applied to the pressure sensor 401, pressure capacitance $C_1$ may be generated between the first and second electrodes 411 and 431. In the pressurized state, the pressure sensor 401 may measure the difference between the pressure capacitance $C_1$ and the initial capacitance $C_0$, i.e., $C_1 - C_0$, and the touch IC 330 may acquire information indicating whether the user's touch operation involves pressure based on the result of the measurement performed by the pressure sensor 401. For example, if the difference between the pressure capacitance $C_1$ and the initial capacitance $C_0$ exceeds a reference value (e.g., a threshold value, which may be a predetermined value), e.g., if a determination is made that effective pressure has been applied to the pressure sensor 401, the touch IC 330 may determine that a touch operation involving pressure has been performed. On the other hand, if the difference between the pressure capacitance $C_1$ and the initial capacitance $C_0$ does not exceed the reference value, e.g., if a determination is made that a relatively low pressure has been applied to the pressure sensor 401, the touch IC 330 may determine that a touch operation not involving pressure has been performed.

In an exemplary embodiment of the present invention, a first shortest horizontal distance $L_1$ from the pressure sensor 401 to the first edge 311a of the second base 310 may differ from a second shortest horizontal distance $L_2$ from the pressure sensor 401 to the second edge 311b of the second base 310. For example, the first shortest horizontal distance $L_1$ may be greater than the second shortest horizontal distance $L_2$. Thus, the pressure sensor 410 may be relatively closer to the second edge 311B than to the first edge 311a in the first portion 311 of the second base 310. For example, the first shortest horizontal distance $L_1$ may be at least about 40% of the minimum width, in the first direction (e.g., X1, X2), of the second base 310, e.g., at least about 40% of the first width $W_{1,X}$ of the first portion 311. Accordingly, a lot-to-lot pressure sensing distribution of the display device 1 can be reduced, and the pressure sensing life of the display device 1 can be increased. This will be described in more detail below with reference to FIGS. 14 and 15.

In an exemplary embodiment of the present invention, the PCB 301 may include a dummy structure 360 disposed on the second base 310. The dummy structure 360 may be disposed between the first edge 311a of the second base 310 and the pressure sensor 401. The dummy structure 360 may also be disposed between the pressure sensor 401 and the fingerprint sensor 500. The dummy structure 360 may at least partially overlap with the display panel 100 in the third direction Z. In an exemplary embodiment of the present invention, a width $W_{401,x}$, in the first direction (e.g., X1, X2), of the pressure sensor 401 may be greater than a width $W_{360}$, in the first direction (e.g., X1, X2), of the dummy structure 360.

A thickness $T_{360}$ of the dummy structure 360 may be substantially the same as a thickness $T_{401}$ of the pressure sensor 401. Thus, each of the dummy structure 360 and the pressure sensor 401 may be in direct contact with a lower surface of the third bonding layer 830 facing the third base 310. For example, the dummy structure 360 may include a first dummy electrode 361, a second dummy electrode 363 spaced apart from the first dummy electrode 361, and a dummy elastic layer 365 disposed between the first and second dummy electrodes 361 and 363. The first and second dummy electrodes 361 and 363 of the dummy structure 360 may include a same material as, and may respectively have a same thickness as, the first and second electrodes 411 and 431 of the pressure sensor 401. The dummy elastic layer 365 of the dummy structure 360 may include a same material as the elastic layer 451 of the pressure sensor 401 and may have the same thickness as the elastic layer 451 of the pressure sensor 401 in the initial state where pressure is yet to be applied. The dummy structure 360 may be electrically connected to the touch IC 330. The first and second dummy electrodes 361 and 363 of the dummy structure 360 may be spaced apart from the first and second electrodes 411 and 431 of the pressure sensor 401.

The dummy structure 360, which has substantially the same thickness as the pressure sensor 401, may have a height difference compensating function. Thus, the dummy structure 360 might not be electrically conductive and might not be electrically connected to the touch IC 330. In an exemplar) embodiment of the present invention when the second bonding layer 820 is disposed between the pressure sensor 401 and the second base 310 and the third bonding layer 830 is disposed on the pressure sensor 401, the dummy structure 360 may at least partially fill the gap between the second and third bonding layers 820 and 830. Accordingly, the physical durability of the PCB package PKG1 can be increased, and the pressure sensing distribution and/or the pressure sensing life of the pressure sensor 401 can be increased. The thickness of the elastic layer 451 of the pressure sensor 401 may be compressively deformed by the user's touch operation, as described above in more detail, for example. As an example, when the dummy structure 360 including the dummy elastic layer 365, which does not have a pressure sensor function but is compressively deformable, is arranged near the pressure sensor 401, the thickness of the PCB package PKG1, which is coupled to the rear of the display panel 100, can be gradually deformable. As a result, the durability of the PCB package PKG1 can be further increased.

Referring to FIGS. 8 and 9, for example, according to an exemplary embodiment of the present invention, a PCB package may include a base (e.g., base 310) and pressure sensor 401 disposed on the base. The dummy structure 360 may be disposed on the base. The dummy structure 360 may be spaced apart from the pressure sensor 401. The touch IC 330 may be disposed on the base. The touch IC 330 may be electrically connected to the pressure sensor 401 (e.g., by pressure sensor wire 350). The touch IC 330 might not be electrically connected to the dummy structure 360. The dummy structure 360 may be closer to an edge of the base than the pressure sensor 401.

The fingerprint sensor 500 may be disposed on the rear surface of the display panel 100. The fingerprint sensor 500 may at least partially overlap with the display panel 100 in the third direction Z. The fingerprint sensor 500 may be inserted in the fingerprint sensor insertion hole of the rear sheet member 200. By disposing the fingerprint sensor 500, which acquires fingerprint information of the user, in the display area DA, a touch sensing function can be imparted to at least part of a region for displaying an image, and the interaction between the user and the display device 1 may enable intuitive manipulation of the display device 1.

The fingerprint sensor 500 may be configured to acquire information regarding the shape of an object with which the user performs a touch operation, for example, information regarding the shape of the surface of a finger of the user. For example, the fingerprint sensor 500 may sense fingerprint information by acquiring information regarding the fine ridges and valleys on the surface of a finger of the user.

In an exemplary embodiment of the present invention, the fingerprint sensor 500 may include a circuit board 510, a light receiving portion 530 disposed on the circuit board 510, and a fingerprint sensor housing 550 receiving the light receiving portion 530. The circuit board 510 may provide a space in which the light receiving portion 530 is to be arranged and may have circuitry for driving the fingerprint sensor 500. The fingerprint sensor housing 550 may at least partially surround the light receiving portion 530 and may thus modularize the fingerprint sensor 500. The light receiving portion 530 may be configured to measure the amount of light incident upon the light receiving portion 530 or the amount of time that it takes for light to arrive at the light receiving portion 530. The fingerprint sensor 500 may include the light receiving portion 530 and may acquire fingerprint information of the user based on the amount of light incident upon the light receiving portion 530, but exemplary embodiments of the present invention are not limited thereto. For example, the fingerprint sensor 500 may have various configurations other than that set forth herein.

In a plan view, the fingerprint sensor 500 might not overlap with the PCB 301 in the third direction Z. For example, the fingerprint sensor 500 may be disposed between the second and third portions 312 and 313 of the second base 310 of the PCB 301. For example, the rear surface of the fingerprint sensor 500 may be exposed, rather than being covered by the PCB 301, but exemplary embodiments of the present invention are not limited thereto. In a plan view, the fingerprint sensor 500 might not overlap with the pressure sensor 401 in the third direction Z, but may be spaced apart from the pressure sensor 401 in the first direction (e.g., X1, X2). Thus, the display device 1 can be slimmed down, and the durability of the display device 1 can be increased by stably attaching the pressure sensor 401 and the fingerprint sensor 500.

In the display device 1 according to an exemplary embodiment of the present invention, the fingerprint sensor 500 may be configured to be activated for a predetermined amount of time in response to effective pressure being applied to the pressure sensor 401, but exemplary embodiments of the present invention are not limited thereto. For example, if the touch IC 330 determines that a touch operation involving pressure has been performed by the user, the fingerprint sensor 500 may be activated. Accordingly, although the pressure sensor 401 and the fingerprint sensor 500 might be disposed not to overlap with each other in the third direction Z, fingerprint sensing and pressure sensing can both be performed at substantially the same time simply by one-time access of the user. Alternatively, the fingerprint sensor 500 may be configured to be activated only when effective pressure (e.g., pressure exceeding a predetermined threshold) is being applied to the pressure sensor 401 or to perform various functions other than that of being activated by the pressure sensor 401.

In an exemplary embodiment of the present invention, a width $W_{401,Y}$, in the second direction Y, of the pressure sensor 401 may be greater than a width $W_{500,Y}$, in the second direction Y, of the fingerprint sensor 500. In a case where the user performs a touch operation at the location of the fingerprint sensor 500, rather than at the location of the pressure sensor 401, a relativity large pressure detection area can be secured by forming the width $W_{401,Y}$, in the second direction Y, of the pressure sensor 401 to be greater than the width $W_{500,Y}$, in the second direction Y, of the fingerprint sensor 500, and as a result, fingerprint sensing and pressure sensing can both be performed at substantially the same time simply by one-time access of the user. This will be described later in more detail below with reference to FIGS. 14 and 15.

As an example, the increase of the durability of the PCB package PKG1 and the sensing sensitivity of the pressure sensor 401 will be described in more detail below with reference to FIGS. 14 and 15.

Figure 14:
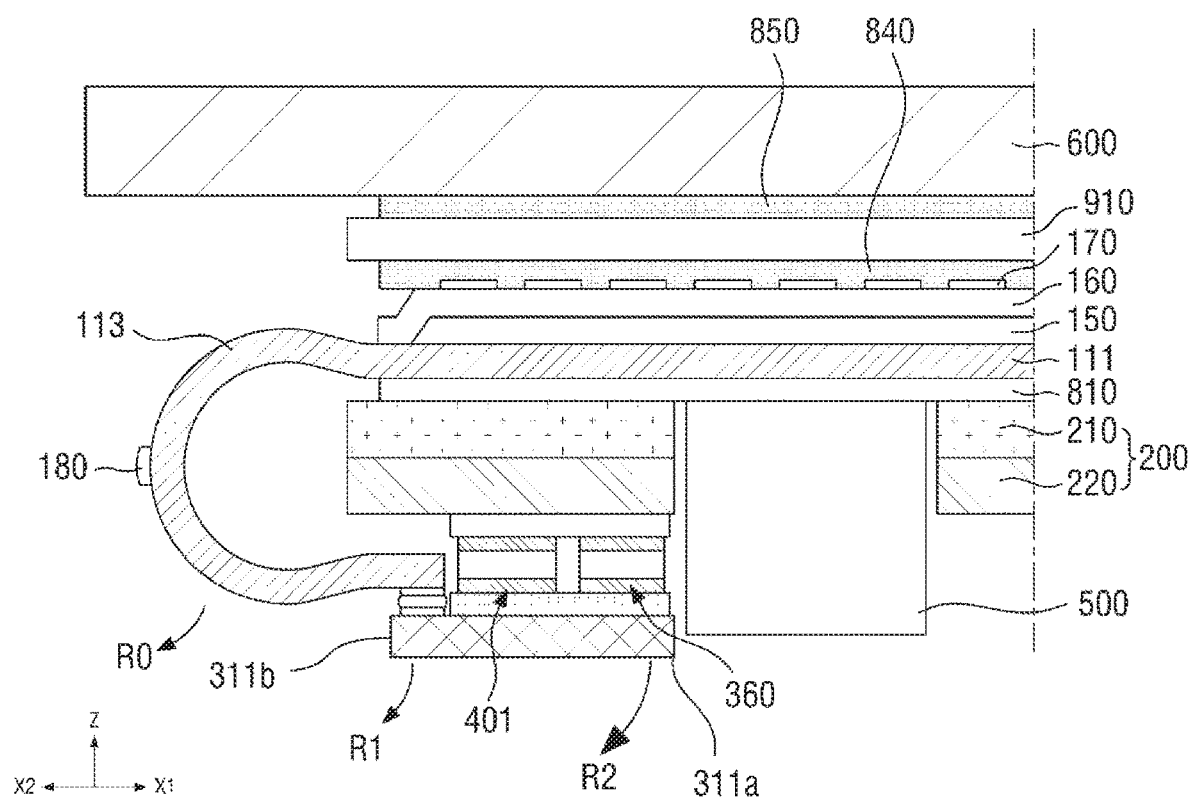
FIG. 14 is a schematic view illustrating a restoring force applied to the elements of the display device of FIG. 1.

FIG. 14 is a schematic view illustrating a restoring force applied to the elements of the display device of FIG. 1. FIG. 15 is a plan view of the pressure sensor of FIG. 10. For example, FIG. 15 is a plan view showing the location of detection of pressure by the pressure sensor 401 in a case where the user performs a touch operation at the location of the fingerprint sensor 500.

Referring to FIGS. 1 through 15, in an exemplary embodiment of the present invention when the display panel 100 includes the driver IC supporting portion 113, which is bent in the first direction (e.g., X1, X2), a force may be applied to the PCB 301 by the driver IC supporting portion 113. For example, in a case where the driver IC supporting portion 113 is bent in the first direction (e.g., X1, X2), an initial restoring force R0 may be applied to the driver IC supporting portion 113 due to the elastic force of the driver IC supporting portion 113 (or the first base 110).

Due to the initial restoring force R0, a first restoring force R1 may be applied to and around the second edge 311b in the first direction (e.g., X1, X2), of the second base 310, which is coupled to the driver IC supporting portion 113. A second restoring force R2 applied near the first edge 311a, which is relatively distant from the display panel pads 190 and the PCB pads 390, may be stronger than the first restoring force R1 near the second edge 311b. As an example, the initial restoring force R0, the first restoring force R1 and the second restoring force R2 may each be a force applied at an angle to the Z direction (see, e.g., FIG. 14).

The pressure sensor 401 may acquire pressure information from any slight bend in the display device 1, and thus the supporting structure of the pressure sensor 401 may affect the sensing sensitivity of the pressure sensor 401. As an example, if the coupling between the pressure sensor 401 and the rear sheet member 200 and/or between the pressure sensor 401 and the PCB 301 is insufficient, the pressure sensor 401 might not be able to be properly supported at the top and the bottom thereof. As a result, a minimum effective pressure level for detecting a touch operation involving pressure may increase, or the sensing sensitivity of the pressure sensor 401 may decrease.

The second restoring force R2 may be applied to and around the first edge 311a of the second base 310, but exemplary embodiments of the present invention are not limited thereto. Thus, the bonding force between the second bonding layer 820 and the second base 310 and/or between the third bonding layer 830 and the rear sheet member 200 may be weaker near the first edge 311a than near the second edge 311b.

By sufficiently securing the horizontal distance between the pressure sensor 401 and the first edge 311a of the second base 310 of the PCB 301, e.g., the first shortest horizontal distance $L_1$, the horizontal area of the PCB 301 can be minimized, and an unexpected increase in effective pressure for the pressure sensor 401 and a decrease in the sensing sensitivity of the pressure sensor 401 can be prevented. For example, positioning the pressure sensor 401 to be relatively distance from the first edge 311 may reduce or eliminate a reduction in pressure sensor 401 sensitivity that might occur as a result of exposure to the second restoring force R2. Thus, an occurrence of a defect in the pressure sensor 401 may be reduced, and reliability of the PCB package (e.g., PCB package PKG1) according to an exemplary embodiment of the present invention may be increased.

Figure 15:
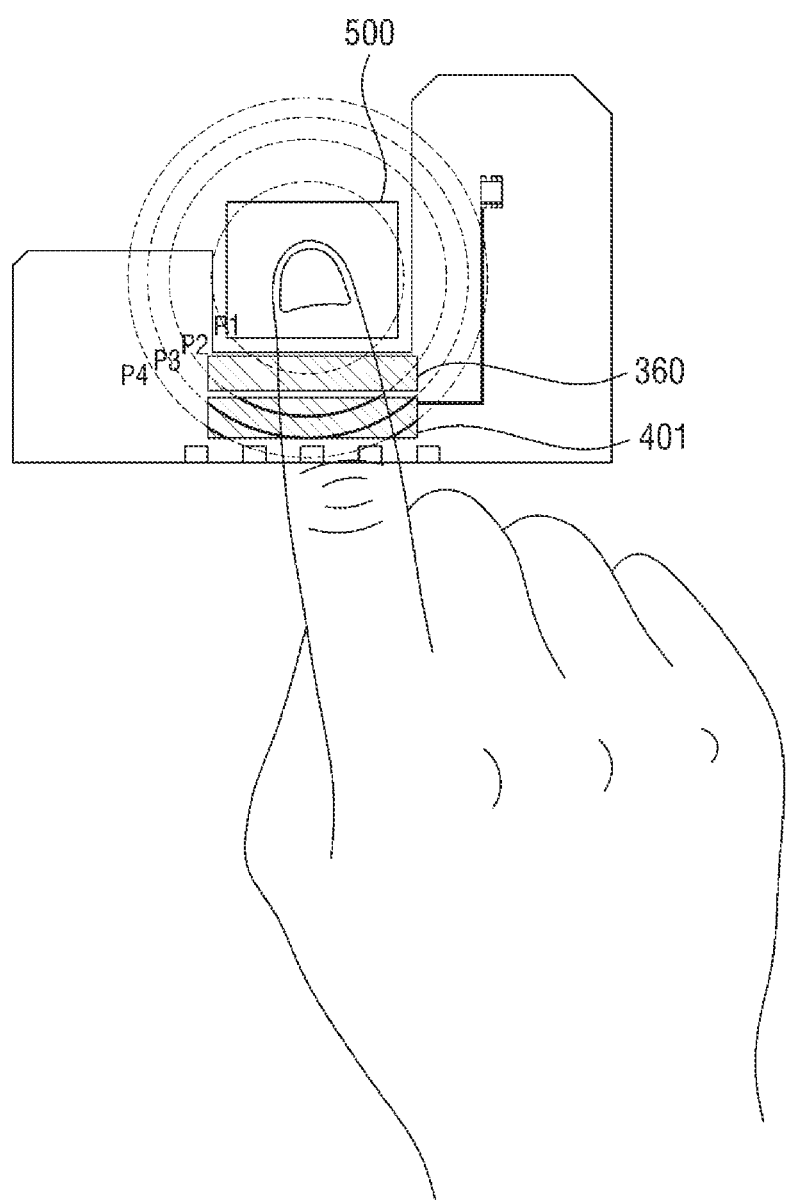
FIG. 15 is a plan view of the pressure sensor of FIG. 10.

Referring to FIG. 15, for example, the pressure applied to the display device 1 by the user's touch operation may be delivered in the form of concentric waves substantially having a touch point corresponding to the user's touch operation as their common center. In a case where the user performs a touch operation at the location of the fingerprint sensor 500, rather than at the location of the pressure sensor 401, the pressure sensor 401 and the touch IC 330 may determine whether the user's touch operation involves pressure based on the pressure delivered to a point spaced apart from a center of the fingerprint sensor. For example, the pressure sensor 401 and the touch IC 330 may determine whether the user's touch operation involves pressure based on the pressure delivered to second points P2, which are substantially the same distance apart from the touch point, third points P3, which are relatively more distant with respect to the second points P2, and fourth points P4, which are relatively more distant with respect to the third points P3. For example, the pressure sensor 401 and the touch IC 330 may determine whether the user's touch operation involves pressure based on the pressure applied to the second points P2, the third points P3, and the fourth points P4, which all overlap with the pressure sensor 401.

Alternatively, the pressure delivered to first points P1, which overlap not with the pressure sensor 401, but with the dummy structure 360, might not affect the sensing operation of the pressure sensor 401 and the determination operation of the touch IC 330. As described above, for example, the pressure sensor 401 and the touch IC 330 may determine whether the user's touch operation involves pressure based on the relationship between the difference between the pressure capacitance $C_1$ and the initial capacitance $C_0$, i.e., $C_1-C_0$, and the reference value. For example, since the durability of the display device 1 may be relatively weak near the first edge 311a of the second base 310 of the PCB 301, the reliability of the difference between the pressure capacitance $C_1$ and the initial capacitance $C_0$, detected from near the first edge 311a, may be relatively low, a minimum effective pressure level for detecting a touch operation involving pressure may increase, or the sensing sensitivity of the pressure sensor 401 may decrease However, the display device 1 according to an exemplary embodiment of the present invention may detect a touch operation involving pressure based on pressure detected from the second points P2, the third points P3, and the fourth points P4 without considering pressure detected from near the first edge 311a of the second base 310 of the PCB 301, e.g., pressure detected from the first points P1. Accordingly, the formation of a pressure sensing distribution can be suppressed, and the pressure sensing life of the display device 1 can be increased.

Since the width $W_{401,Y}$, in the second direction Y, of the pressure sensor 401 may be configured to be greater than the width $W_{500,Y}$, in the second direction Y, of the fingerprint sensor 500, the area of detection of pressure delivered in the form of concentric waves, e.g., with respect to the second points P2, the third points P3, and the fourth points P4, which contribute to pressure sensing, can be sufficiently secured. For example, the width $W_{401,Y}$, in the second direction Y may correspond with a width of the concentric ring formed by the second points P2.

Display devices according to an exemplary embodiment of the present invention will be described in more detail below. Descriptions of elements or features that are the same or substantially the same as those described above with respect to the display device 1 may be omitted below.

Figure 16:
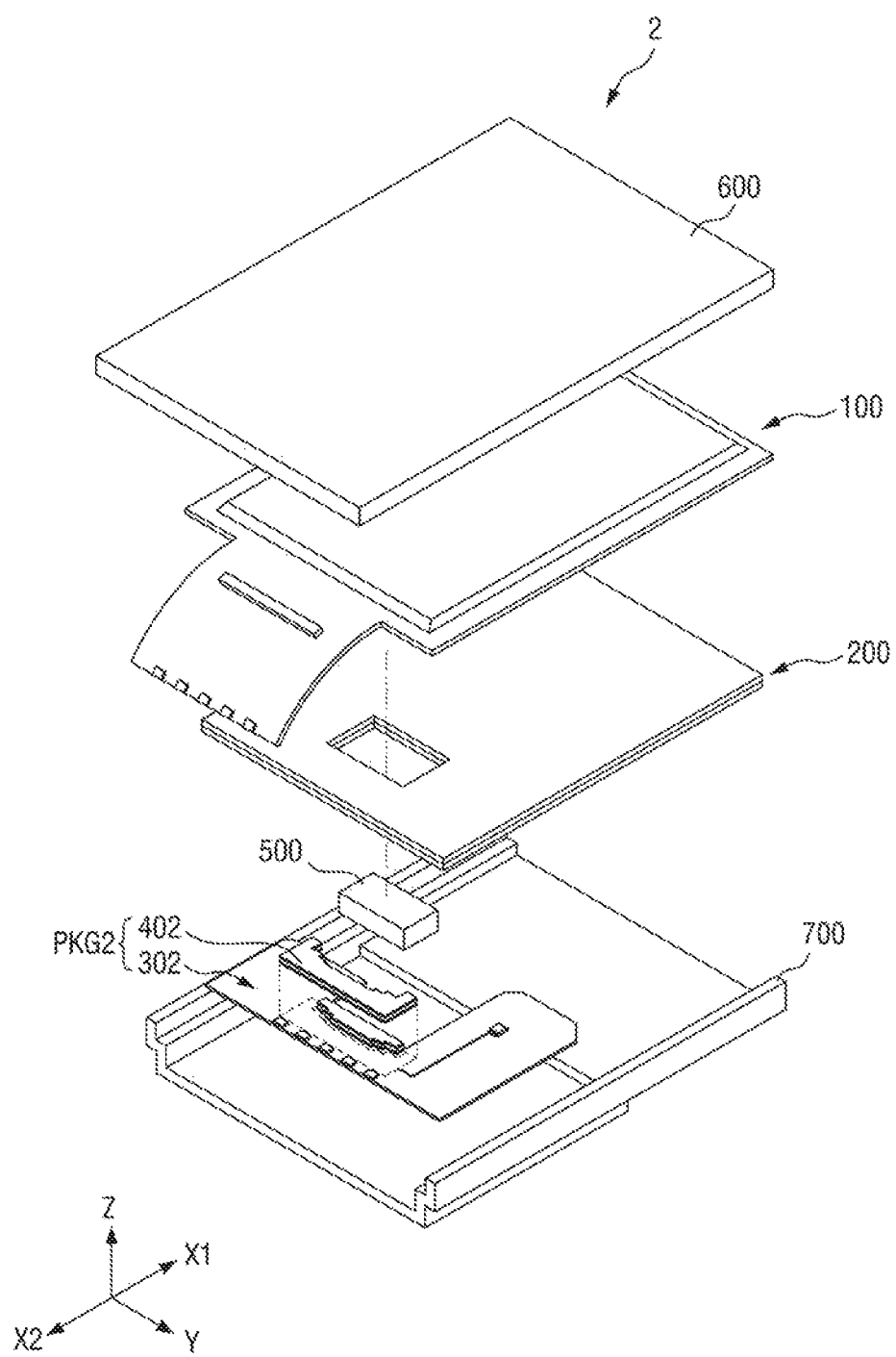
FIG. 16 is an exploded perspective view of a display device according to an exemplary embodiment of the present invention.
Figure 17:
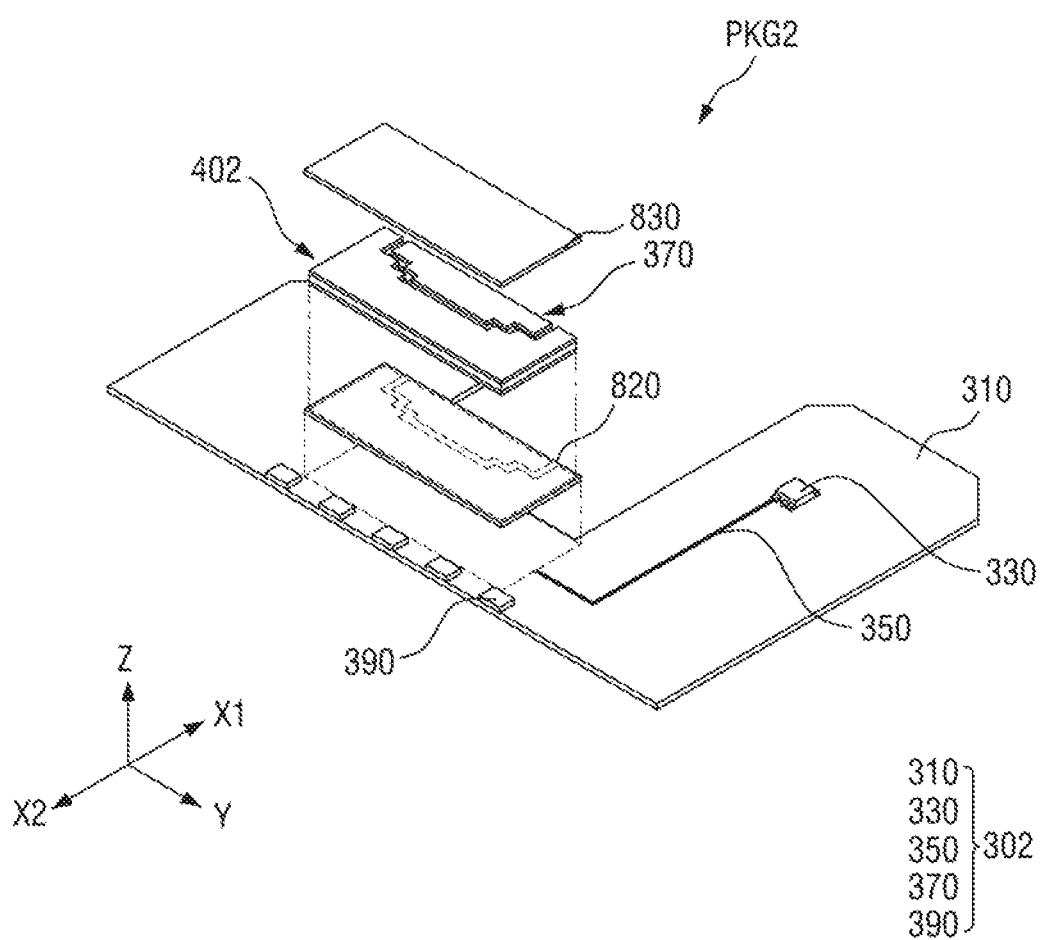
FIG. 17 is a perspective view of a PCB package of FIG. 16.
Figure 18:
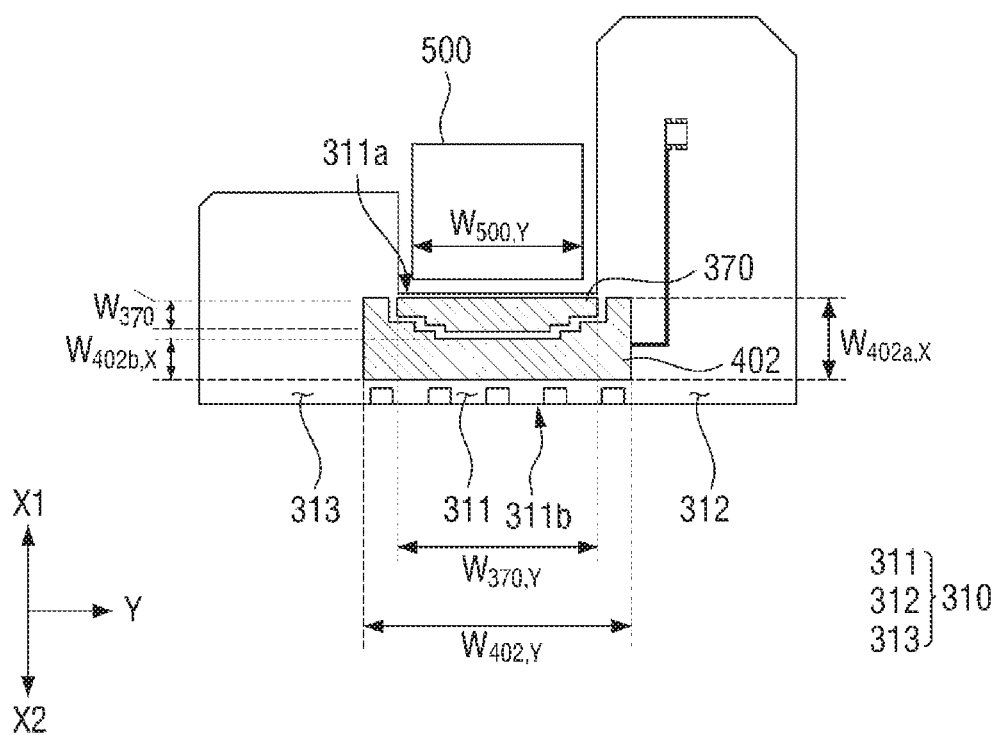
FIG. 18 is a plan view of a PCB package and a fingerprint sensor of FIG. 16.

FIG. 16 is an exploded perspective view of a display device according to an exemplary embodiment of the present invention. FIG. 17 is a perspective view of a PCB package of FIG. 16. FIG. 18 is a plan view of a PCB package and a fingerprint sensor of FIG. 16.

Referring to FIGS. 16 through 18, the PCB package PKG2 of a display device 2 differs from the PCB package PKG1 of the display device 1 in that a pressure sensor 402 may at least partially surrounds a dummy structure 370. Thus, the dummy structure 370 and the pressure sensor 402 may each have a different shapes than as described above with respect to the display device 1.

In a plan view, an edge of the pressure sensor 402 facing the dummy structure 370 may be partially recessed in the second direction X2. For example, the pressure sensor 402 may include maximum width portions having a maximum width $W_{402a,X}$ in the first direction (e.g., X1, X2) and a minimum width portion having a minimum width $W_{402b,X}$ in the first direction (e.g., X1, X2). The minimum width portion of the pressure sensor 402 may be located in the central part, in the second direction Y, of the pressure sensor 402.

The maximum width $W_{402a,X}$, in the first direction (e.g., X1, X2), of the pressure sensor 402 may be greater than a maximum width $W_{370}$, in the first direction (e.g., X1, X2), of the dummy structure 370, and a maximum width $W_{402,Y}$, in the second direction Y, of the pressure sensor 402 may be greater than a width $W_{370,Y}$, in the second direction Y, of the dummy structure 370. The maximum width $W_{402,Y}$, in the second direction Y, of the pressure sensor 402 may be greater than a width $W_{500,Y}$, in the second direction Y, of the fingerprint sensor 500.

The dummy structure 370 may be disposed between the pressure sensor 402 and the fingerprint sensor 500. The thickness of the dummy structure 370 may be substantially the same as the thickness of the pressure sensor 402. In a plan view, an edge of the dummy structure 370 facing the pressure sensor 402 may have a shape corresponding to the shape of the recessed edge of the pressure sensor 402.

In an exemplary embodiment of the present invention, a first shortest horizontal distance (see, e.g., $L_1$ of FIG. 9) between the minimum width portion of the pressure sensor 402 and the first edge 311a of a second base 310 may be at least about 40% of the minimum width, in the first direction (e.g., X1, X2), of the second base 310, e.g., at least about 40% of a first width (e.g., $W_{1,X}$ of FIG. 9) of the first portion 311 of the second base 310. For example, by sufficiently securing the horizontal distance between the minimum width portion of the pressure sensor 402 and the first edge 311a of the second base 310, the horizontal area of a PCB 302 can be minimized, and an unexpected increase in effective pressure for the pressure sensor 402 and a decrease in the sensing sensitivity of the pressure sensor 402 can be prevented.

The increase of the durability of the PCB package PKG2 and the sensing sensitivity of the pressure sensor 402 will be described in more detail below with reference to FIGS. 19 and 20.

Figure 19:
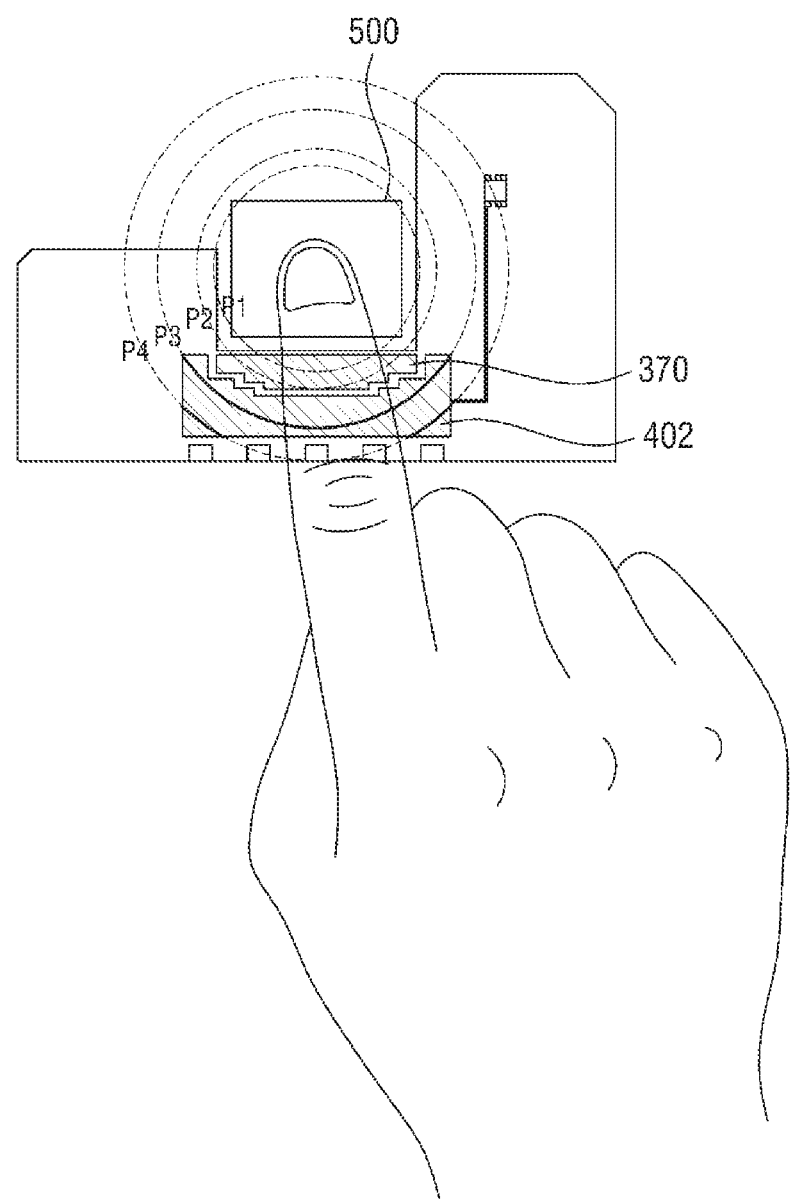
FIGS. 19 and 20 are plan views of a pressure sensor of FIG. 16.
Figure 20:
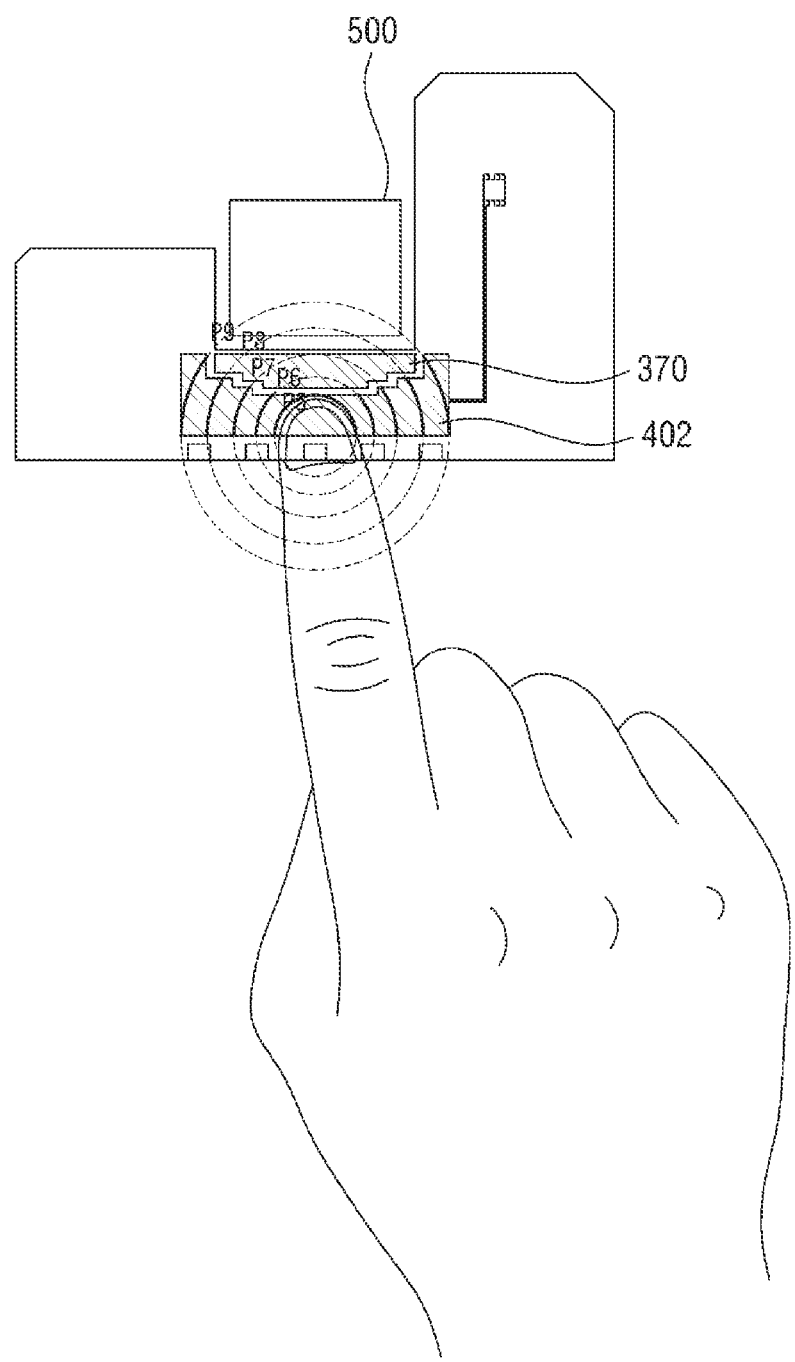

FIGS. 19 and 20 are plan views of a pressure sensor of FIG. 16. For example, FIG. 19 is a plan view showing the location of detection of pressure by the pressure sensor 402 in a case where a user performs a touch operation at the location of the fingerprint sensor.

For example, referring to FIG. 19, in a case where the user performs a touch operation at the location of the fingerprint sensor 500, rather than at the location of the pressure sensor 402, the pressure sensor 402 and a touch IC 330 may determine whether the user's touch operation involves pressure based on the pressure delivered to third points P3, which are substantially the same distance apart from a touch point corresponding to the user's touch operation, and fourth points P4, which are relatively more distant from the touch point than the third points P3. For example, the pressure sensor 402 and the touch IC 330 may determine whether the user's touch operation involves pressure based on the pressure applied to the third points P3 and the fourth points P4, which all overlap with the pressure sensor 402.

Alternatively, the pressure delivered to first points P1, which overlap not with the pressure sensor 402, but with the dummy structure 370, might not affect the sensing operation of the pressure sensor 402 and the determination operation of the touch IC 330. For example, the display device 2 may detect a touch operation involving pressure simply based on pressure detected from the third points P3 and the fourth points P4 without considering pressure detected from the first points P1 and second points P2. Accordingly, the formation of a pressure sensing distribution can be suppressed, and the pressure sensing life of the display device 2 can be increased.

As an example, when the pressure sensor 402 is configured to have the minimum width $W_{402b,X}$ in the central part thereof in the second direction Y where the user's touch operation is concentrated, the generation of a pressure sensing distribution can be suppressed, and the pressure sensing life of the display device 2 can be increased. Also, when the pressure sensor 402 is configured to have the maximum width $W_{402a,X}$ on the sides thereof in the second direction Y, the precision of sensing can be further increased. For example, by increasing the area of detection of pressure delivered in the form of concentric waves, the third points P3 and the fourth points P4, which contribute to pressure sensing, can be sufficiently secured. By sufficiently securing the third points P3 and the fourth points P4, the minimum width $W_{402b,X}$ of the pressure sensor 402 can be further reduced, and the first shortest horizontal distance (see, e.g., $L_1$ of FIG. 9) between the minimum width portion of the pressure sensor 402 and the first edge 311a of the second base 310 can be further increased.

For example, FIG. 20 is a plan view showing the location of detection of pressure by the pressure sensor 402 in a case where the user performs a touch operation at the location of the pressure sensor 402.

For example, referring to FIG. 20, in a case where the user performs a touch operation substantially at the location of the pressure sensor 402, the pressure sensor 402 and the touch IC 330 may determine whether the user's touch operation involves pressure based on the pressure delivered to fifth points P5, which are substantially the same distance apart from a touch point corresponding to the user's touch operation, sixth points P6, which are relatively more distant from the touch point than the fifth points P5, seventh points P7, which are relatively more distant from the touch point than sixth points P6, eighth points P8, which are relatively more distant from the touch point than the seventh points P7, and ninth points P9, which are relativity more distant from the touch point than the eighth points P8. For example, the pressure sensor 402 and the touch IC 330 may determine whether the user's touch operation involves pressure based on the pressure delivered to all points overlapping with the pressure sensor 402 and receiving pressure from the user's touch operation.

Since the pressure from the user's touch operation can be sufficiently detected not only from points that are relatively close to the touch point (e.g., such as the fifth points P5), but also from points that are relatively distant from the touch point (e.g., such as the ninth points P9), the sensing sensitivity of the pressure sensor 402 can be further increased.

A display panel 100, a rear sheet member 200, the fingerprint sensor 500, a window glass 600, and a rear cover 700 of the display device 2 may be substantially the same as those described above with reference to FIGS. 1 through 15, and thus, duplicative descriptions may be omitted below.

Figure 21:
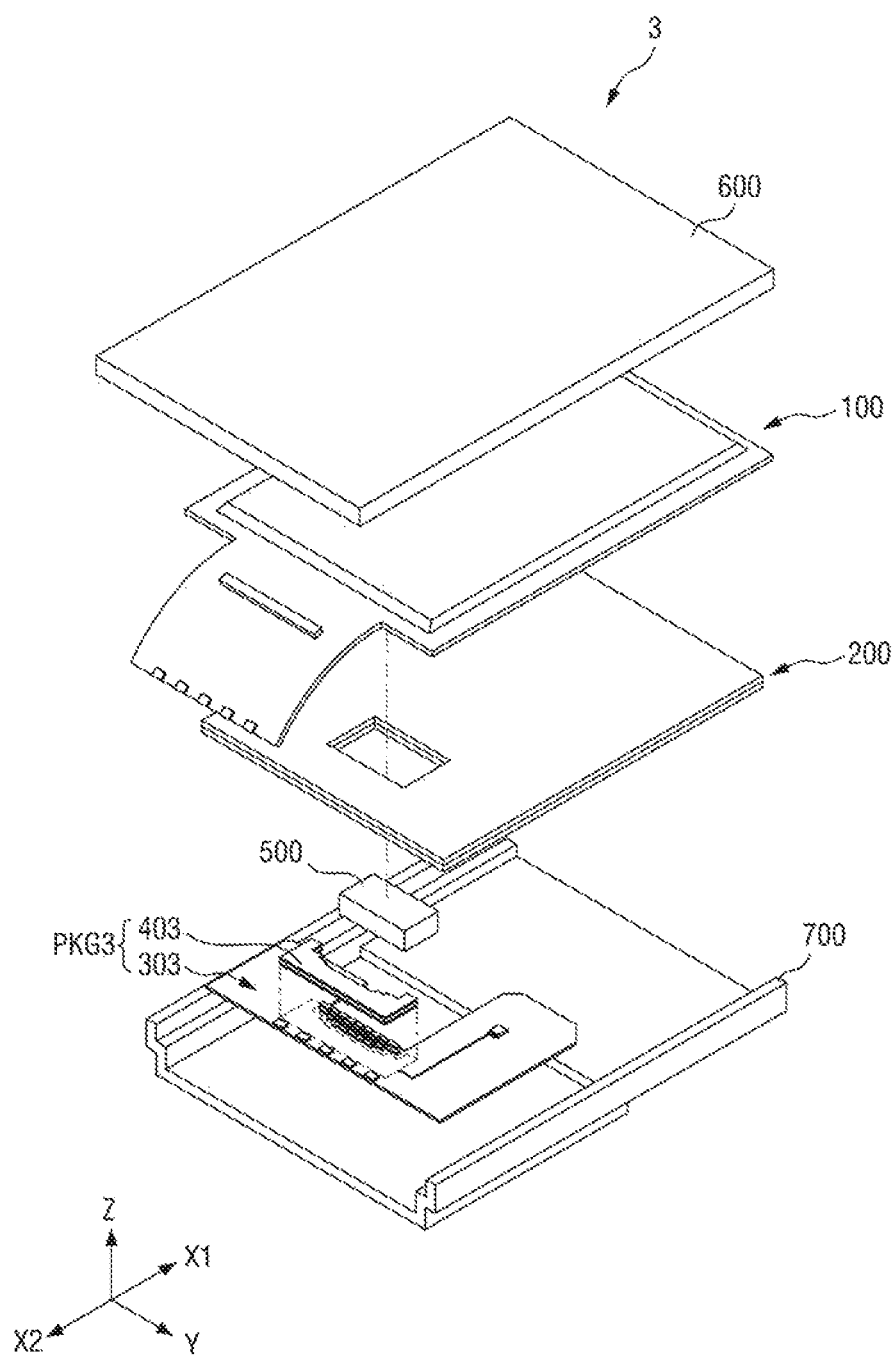
FIG. 21 is an exploded perspective view of a display device according to an exemplary embodiment of the present invention.
Figure 22:
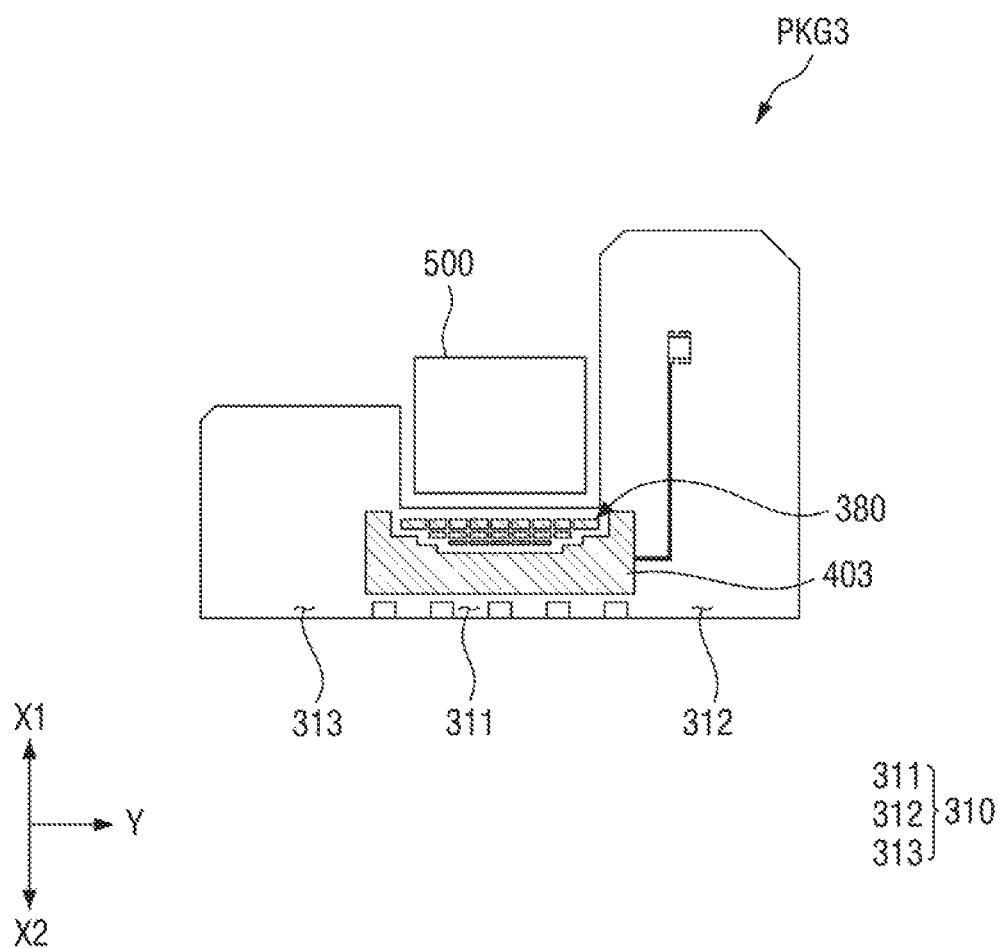
FIG. 22 is a plan view of a PCB package and a fingerprint sensor of FIG. 21.

FIG. 21 is an exploded perspective view of a display device according to an exemplary embodiment of the present invention. FIG. 22 is a plan view of a PCB package and a fingerprint sensor of FIG. 21.

Referring to FIGS. 21 and 22, a PCB package PKG3 of a display device 3 differs from the PCB package PKG2 of the display device 2 in that a plurality of dummy structures 380 may be provided. The PCB package PDG3 may include a pressure sensor 403 and a PCB 303.

In an exemplary embodiment of the present invention, the dummy structures 380 may have substantially the same thickness as the pressure sensor 403 and may thus have a height difference compensating function. For example, the dummy structures 380 may have a predetermined thickness and a predetermined area, and thus the dummy structures may stably fill a gap between second and third bonding layers and may be spaced apart from one another in a plan view. The dummy structures 380 may be spaced apart from one another in the first direction (e.g., X1, X2) and in the second direction Y. The area occupied by the dummy structures 380 may be smaller than the area occupied by the dummy structure 370 described above with reference to FIGS. 16 and 17.

As described above, the pressure sensor 403 may include first and second electrodes having conductivity, and each of the dummy structures 380 may include first and second dummy electrodes having conductivity. However, exemplary embodiments of the present invention are not limited thereto, and the dummy structures 380 might not be electrically conductive. By minimizing the area occupied by the first and second dummy electrodes of each of the dummy structures 380, the generation of unexpected capacitance between the conductive layers of the dummy structures 380 and the conductive layer of the pressure sensor 403 can be reduced or eliminated.

A display panel 100, a rear sheet member 200, the fingerprint sensor 500, a window glass 600, and a rear cover 700 of the display device 3 may be substantially the same as described above with reference to FIGS. 1 through 15, and thus, duplicative descriptions may be omitted below.

A preparation example and a comparative example will be described below with reference to FIGS. 23-25.

Preparation Example 60 sample display devices according to a preparation example may be fabricated in accordance with the exemplary embodiment of the present invention described with reference to FIG. 1. In each of the sample display devices according to a preparation example, a capacitive pressure sensor may be used, the area of the pressure sensor may be about 80 mm$^2$, and the shortest horizontal distance between an edge (e.g., a first edge), in a vertical direction, of a base film of a PCB and the pressure sensor may be about 3.35 mm.

Figure 23:
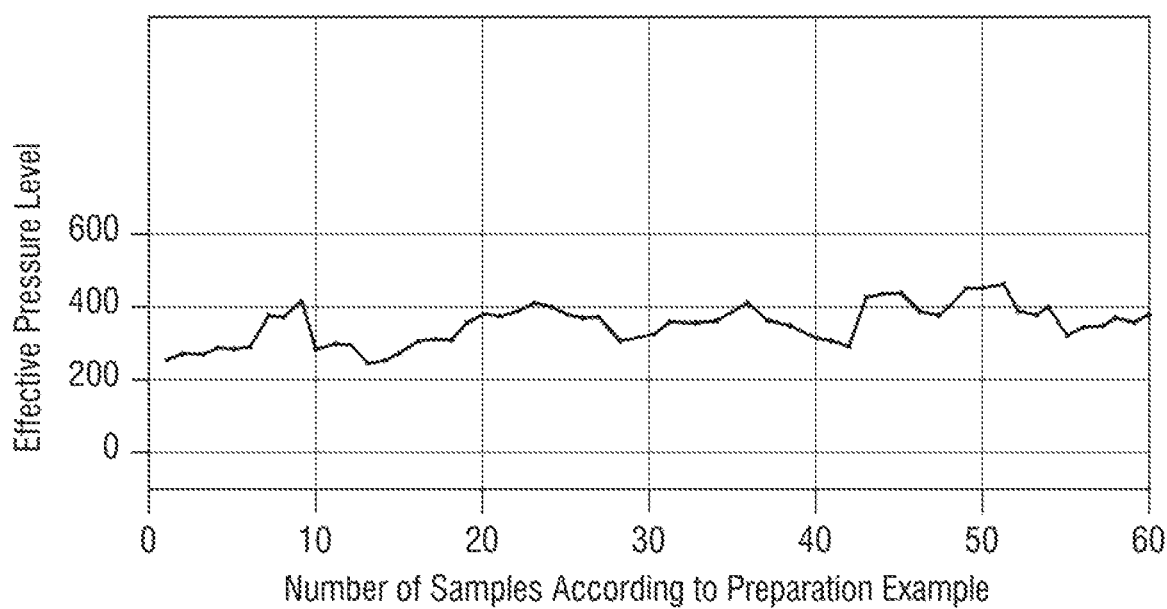
FIG. 23 is a graph of the effective pressure of samples according to a preparation example.

A minimum effective pressure level for detecting a touch operation involving pressure may be measured from each of the sample display devices according to a preparation example, and exemplary results of such a measurement are as shown in FIG. 23.

Comparative Example 66 sample display devices according to a comparative example may be fabricated. The sample display devices according to a comparative example may be almost the same as the sample display devices according to a preparation example, except that in each of the sample display devices according to a comparative example, the shortest horizontal distance between an edge (e.g., a first edge), in a vertical direction, of a base film of a PCB and a pressure sensor may be about 1.3 mm. For example, the sample display devices according to a comparative example may be the same as the sample display devices according to a preparation example in terms of the area occupied by the pressure sensor and the location of the pressure sensor in a horizontal direction.

Figure 24:
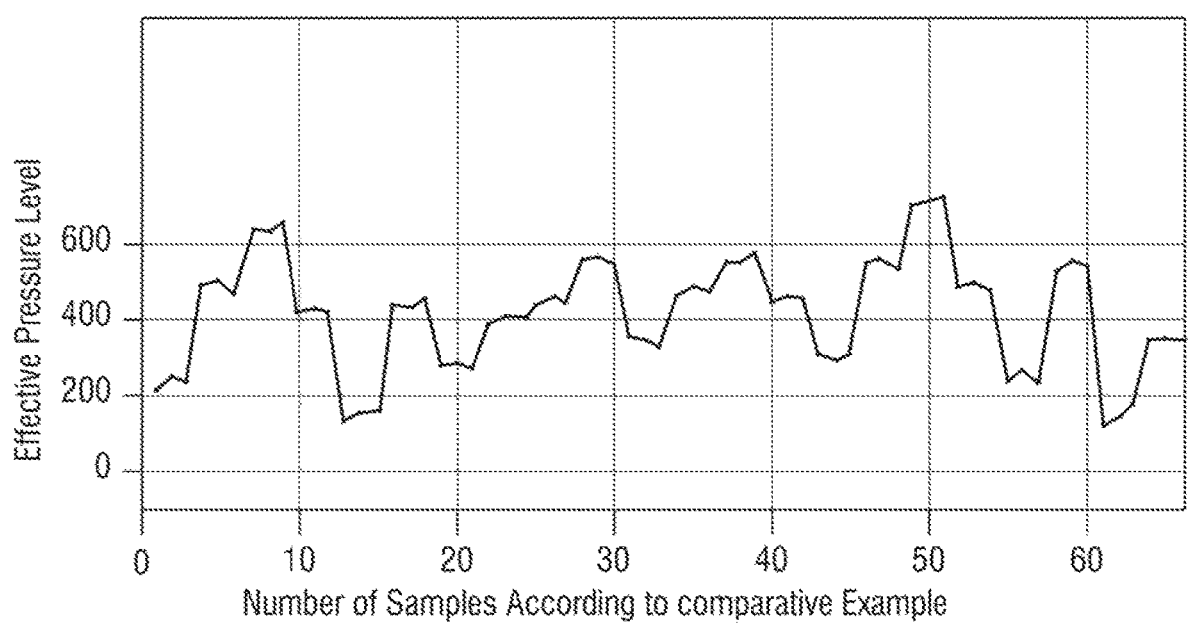
FIG. 24 is a graph of the effective pressure of samples according to a comparative example.

A minimum effective pressure level for detecting a touch operation involving pressure may be measured from each of the sample display devices according to a comparative example, and exemplary results of such a measurement are as shown in FIG. 24.

FIG. 23 is a graph of the effective pressure of the samples according to a preparation example. FIG. 24 is a graph of the effective pressure of samples according to a comparative example.

Referring to FIGS. 23 and 24, the sample display devices according to a preparation example may generally have a relatively uniform minimum effective pressure level as compared to the sample display devices according to a comparative example. For example, a lot-to-lot sensing distribution can be reduced by increasing the distance between a pressure sensor and an edge, in a vertical direction, of a PCB.

Figure 25:
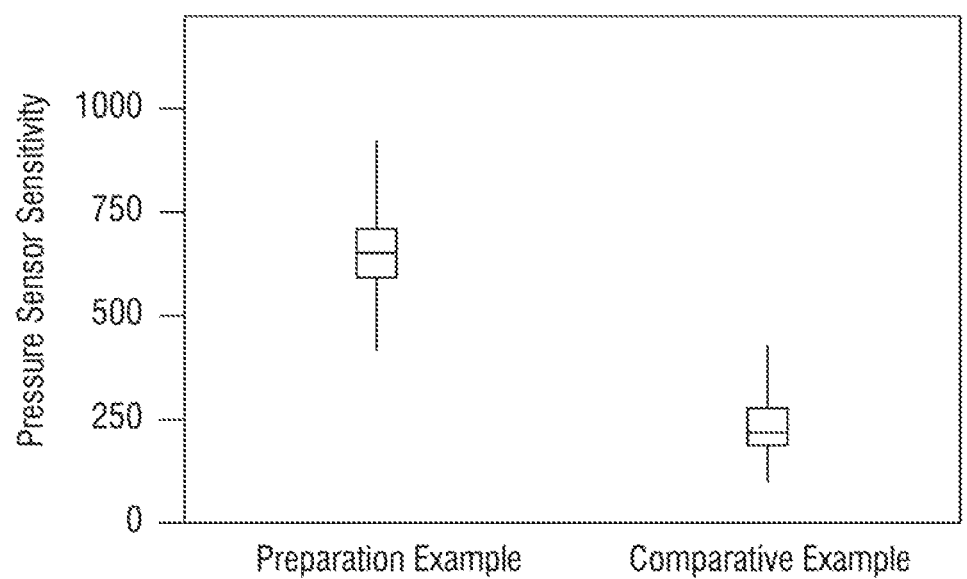
FIG. 25 is a graph comparing the pressure sensor sensitivities of the samples according to a preparation example and the samples according to a comparative example.

FIG. 25 is a graph comparing the pressure sensor sensitivity of the samples according to a preparation example and the samples according to a comparative example.

Referring to FIG. 25, the sample display devices according to a preparation example may have about 2 to 2.5 times higher pressure sensor sensitivity than the sample display devices according to a comparative example.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
   a display panel;
   a printed circuit board (PCB) connected to the display panel and including an insulating base;
   a pressure sensor disposed to overlap with the display panel;
   a fingerprint sensor disposed to overlap with the display panel and spaced apart, on a first side in a first direction, from the pressure sensor; and
   a dummy structure on the insulating base, which is disposed between the pressure sensor and the fingerprint sensor,
   wherein a first distance from the pressure sensor to a first edge of the insulating base adjacent to the fingerprint sensor is greater than a second distance from the pressure sensor to a second edge of the insulating base opposite the fingerprint sensor.

2. The display device of claim 1, wherein
   in a plan view, the pressure sensor and the fingerprint sensor are disposed at least partially within a display area of the display panel, and
   in a plan view, the pressure sensor and the fingerprint sensor do not overlap with each other.

3. The display device of claim 2, wherein a minimum width, in a second direction perpendicular to the first direction, which intersects the first direction, of the pressure sensor is greater than a maximum width, in the second direction, of the fingerprint sensor.

4. The display device of claim 3, wherein
   the insulating base includes a first portion having a first width in the first direction, a second portion having a second width, which is greater than the first width, in the first direction, and a third portion having a third width, which is greater than the first width, in the first direction and spaced apart from the second portion with the first portion disposed between the second portion and the third portion, and
   the fingerprint sensor is disposed at least partially between the second and third portions.

5. The display device of claim 4, wherein the display area is longer in the first direction than in the second direction.

6. The display device of claim 2, wherein the first distance is at least 40% of a minimum width, in the first direction, of the insulating base.

7. The display device of claim 1, wherein
   the pressure sensor is disposed between the display panel and the insulating base, and
   the PCB is disposed between the display panel and the insulating base and further includes the dummy structure, wherein the dummy structure is disposed between the pressure sensor and the fingerprint sensor.

8. The display device of claim 7, wherein a thickness of the pressure sensor is substantially the same as a thickness of the dummy structure.

9. The display device of claim 7, wherein
   the pressure sensor includes a first electrode having conductivity, a second electrode spaced apart from the first electrode and having conductivity, and an elastic layer disposed between the first and second electrodes, and
   the dummy structure includes a first dummy electrode including a same material as the first electrode, a second dummy electrode spaced apart from the first dummy electrode and including a same material as the second electrode, and a dummy elastic layer disposed between the first and second dummy electrodes and including a same material as the elastic layer.

10. The display device of claim 9, wherein
    the PCB further includes a touch IC disposed on the insulating base and electrically connected to the display panel,
    the pressure sensor is electrically connected to the touch IC, and
    the dummy structure is not electrically connected to the touch IC.

11. The display device of claim 1, further comprising:
    a metal sheet member disposed between the display panel and the pressure sensor,
    wherein in a plan view, the metal sheet member and the fingerprint sensor do not overlap with each other.

12. The display device of claim 11, wherein
    in a plan view, the insulating base and the fingerprint sensor do not overlap with each other, and
    in a plan view, the metal sheet member and the pressure sensor overlap with each other.

13. The display device of claim 11, further comprising:
    a rear cover receiving the display panel, the PCB, the pressure sensor, and the fingerprint sensor,
    wherein
    the insulating base and the rear cover are spaced apart from each other, and
    an air layer is positioned between the insulating base and the rear cover.

14. The display device of claim 1, wherein the display panel includes a driver integrated circuit (IC) supporting portion bent with respect to the first direction and a driver IC disposed on the driver IC supporting portion.

15. The display device of claim 14, wherein
    the display panel includes display panel pads electrically connected to the driver IC, and
    the PCB includes PCB pads disposed on the insulating base between the pressure sensor and the second edge of the insulating base, wherein the PCB pads are electrically connected to the display panel pads.

16. The display device of claim 1, wherein
    the pressure sensor and the fingerprint sensor are spaced apart from each other in a first direction,
    a maximum width, in a second direction, which intersects the first direction, of the pressure sensor is greater than a width, in the second direction, of the fingerprint sensor,
    a thickness of the pressure sensor is substantially the same as a thickness of the dummy structure,
    a maximum width, in the first direction, of the pressure sensor is greater than a width, in the first direction, of the dummy structure, and
    a maximum width, in the second direction, of the pressure sensor is greater than a width, in the second direction, of the dummy structure.

17. The display device of claim 16, wherein a plurality of dummy structures are spaced apart from one another in the first and second directions.

18. A PCB package comprising:
    an insulating base;
    a pressure sensor disposed on the insulating base;
    a touch IC disposed on the insulating base and electrically connected to the pressure sensor;
    a dummy structure disposed on the insulating base and including a first dummy electrode, a second dummy electrode spaced apart from the first dummy electrode, and a dummy elastic layer disposed between the first dummy electrode and the second dummy electrode, wherein a first distance from the pressure sensor to a first edge of the insulating base is different from a second distance from the pressure sensor to a second edge of the insulating base opposite the first edge.

19. The PCB package of claim 18, further comprising:

a plurality of pads disposed on the insulating base between the pressure sensor and the second edge and spaced apart from one another, wherein the dummy structure is disposed between the pressure sensor and the first edge, and has substantially the same thickness as the pressure sensor;

a first bonding layer disposed between the insulating base and the pressure sensor and between the insulating base and the dummy structure; and a second bonding layer spaced apart from the first bonding layer with the pressure sensor and the dummy structure disposed between the first bonding layer and the second bonding layer, wherein the first distance is greater than the second distance.

20. The PCB package of claim 18, wherein the pressure sensor includes a recessed portion, and the dummy structure faces the pressure sensor and has a shape corresponding to a shape of the recessed portion of the pressure sensor.

21. A PCB package comprising:

a base;

a pressure sensor disposed on the base;

a dummy structure disposed on the base and including a first dummy electrxe, a second dummy electrode spaced at from the first dummy electrode, and a dummy elastic layer disposed between the first dummy electrode and the second dummy electrode, wherein the dummy structure is spaced apart from the pressure sensor; and a touch IC disposed on the base, wherein the touch IC is electrically connected to the pressure sensor, and wherein the touch IC is not electrically connected to the dummy structure, wherein the dummy structure is closer to an edge of the base than the pressure sensor.

* * * * *